United States Patent
Chae et al.

(10) Patent No.: US 9,793,441 B2
(45) Date of Patent: *Oct. 17, 2017

(54) LIGHT EMITTING DIODE MODULE FOR SURFACE MOUNT TECHNOLOGY AND METHOD OF MANUFACTURING THE SAME

(71) Applicant: Seoul Viosys Co., Ltd., Ansan-si (KR)

(72) Inventors: Jong Hyeon Chae, Ansan-si (KR); Jong Min Jang, Ansan-si (KR); Won Young Roh, Ansan-si (KR); Dae Woong Suh, Ansan-si (KR); Min Woo Kang, Ansan-si (KR); Joon Sub Lee, Ansan-si (KR); Hyun A Kim, Ansan-si (KR); Kyoung Wan Kim, Ansan-si (KR); Chang Yeon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/271,026

(22) Filed: Sep. 20, 2016

(65) Prior Publication Data

US 2017/0012176 A1   Jan. 12, 2017

Related U.S. Application Data

(63) Continuation of application No. 14/752,413, filed on Jun. 26, 2015, now Pat. No. 9,461,212, which is a (Continued)

(30) Foreign Application Priority Data

Jul. 2, 2012   (KR) .................... 10 2012 0071576
Jun. 26, 2014  (KR) .................... 10 2014 0079218

(51) Int. Cl.
*H01L 33/46*   (2010.01)
*H01L 33/40*   (2010.01)
(Continued)

(52) U.S. Cl.
CPC ............ *H01L 33/46* (2013.01); *H01L 33/20* (2013.01); *H01L 33/385* (2013.01);
(Continued)

(58) Field of Classification Search
CPC ....... H01L 33/46; H01L 33/502; H01L 33/20; H01L 33/385; H01L 33/62; H01L 33/44;
(Continued)

(56) References Cited

U.S. PATENT DOCUMENTS 6,538,299 B1   3/2003   Kwark et al.
7,511,311 B2   3/2009   Kususe et al.
(Continued)

FOREIGN PATENT DOCUMENTS

CN   101237013 A   8/2008
CN   101997072 A   3/2011
(Continued)

OTHER PUBLICATIONS

Hye Lyun Park, Authorized Officer, Korean Intellectual Property Office, International Search Report, PCT Application No. PCT/KR2013/005557, dated Sep. 25, 2013, 2 pages.
(Continued)

*Primary Examiner* — William Coleman
(74) *Attorney, Agent, or Firm* — Perkins Coie LLP

(57) ABSTRACT

An LED is provided to include: a first conductive type semiconductor layer; an active layer positioned over the first conductive type semiconductor layer; a second conductive type semiconductor layer positioned over the active layer; and a defect blocking layer comprising a masking region to cover at least a part of the top surface of the second conductive semiconductor layer and an opening region to partially expose the top surface of the second conductive type semiconductor layer, wherein the active layer and the second conductive type semiconductor layer are disposed to expose a part of the first conductive type semiconductor layer, and wherein the defect blocking layer comprises a first
(Continued)

region and a second region surrounding the first region, and a ratio of the area of the opening region to the area of the masking region in the first region is different from a ratio of die area of the opening region to the area of the masking region in the second region.

18 Claims, 28 Drawing Sheets

Related U.S. Application Data continuation-in-part of application No. 14/588,878, filed on Jan. 2, 2015, now Pat. No. 9,343,644, which is a continuation-in-part of application No. PCT/KR2013/005557, filed on Jun. 24, 2013.

(51) Int. Cl.
| | |
|---|---|
| *H01L 33/20* | (2010.01) |
| *H01L 33/38* | (2010.01) |
| *H01L 33/44* | (2010.01) |
| *H01L 33/62* | (2010.01) |
| *H01L 33/50* | (2010.01) |
| *H01L 33/32* | (2010.01) |

(52) U.S. Cl.
CPC ............ *H01L 33/405* (2013.01); *H01L 33/44* (2013.01); *H01L 33/502* (2013.01); *H01L 33/62* (2013.01); *H01L 33/32* (2013.01); *H01L 2224/16* (2013.01); *H01L 2933/0016* (2013.01)

(58) Field of Classification Search
CPC ... H01L 33/405; H01L 33/32; H01L 2224/16; H01L 2933/0016
See application file for complete search history.

(56) References Cited

U.S. PATENT DOCUMENTS

| | | | |
|---|---|---|---|
| 8,101,964 B2 | 1/2012 | Kitagawa et al. | |
| 8,168,966 B2 | 5/2012 | Biwa et al. | |
| 8,546,836 B2 | 10/2013 | Kamiya et al. | |
| 9,343,644 B2* | 5/2016 | Chae | H01L 33/62 |
| 9,461,212 B2* | 10/2016 | Chae | H01L 33/405 |
| 2007/0057272 A1 | 3/2007 | Urashima | |
| 2007/0262338 A1 | 11/2007 | Higashi et al. | |
| 2012/0049219 A1 | 3/2012 | Kamiya et al. | |
| 2013/0032810 A1 | 2/2013 | Chen | |
| 2015/0108525 A1 | 4/2015 | Chae et al. | |

FOREIGN PATENT DOCUMENTS

| | | |
|---|---|---|
| CN | 102270722 A | 12/2011 |
| JP | 2006108161 A | 4/2006 |
| JP | 2007080899 A | 3/2007 |
| JP | 2009188422 A | 8/2009 |
| JP | 2011138820 A | 7/2011 |
| TW | 200535960 A | 11/2005 |

OTHER PUBLICATIONS

State Intellectual Property Office PRC, Chinese Patent Application No. 201380035713.5, Office Action, dated Aug. 25, 2016, 10 pages.
Korean Intellectual Property Office, Korean Patent Application No. 10-2012-0071576, Office Action, dated Aug. 16, 2016, 6 pages.
Non-Final Office Action for U.S. Appl. No. 15/377,731, dated Feb. 27, 2017, 13 pages.

\* cited by examiner

[Fig. 1]
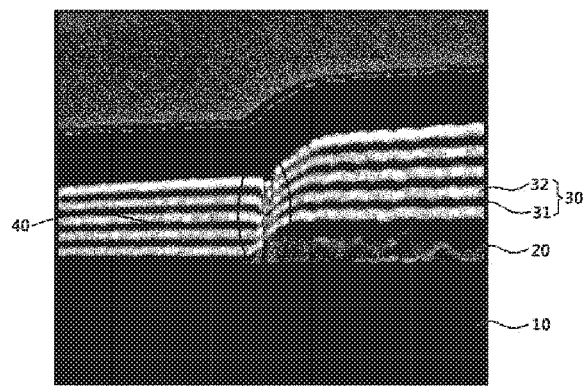
[Fig. 2]
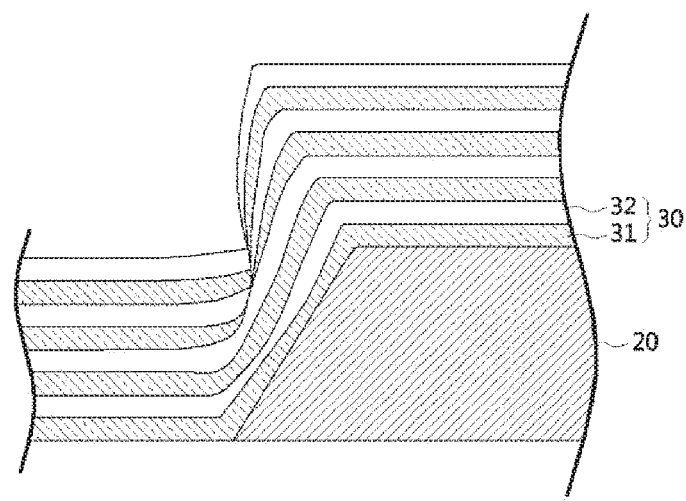
[Fig. 3]
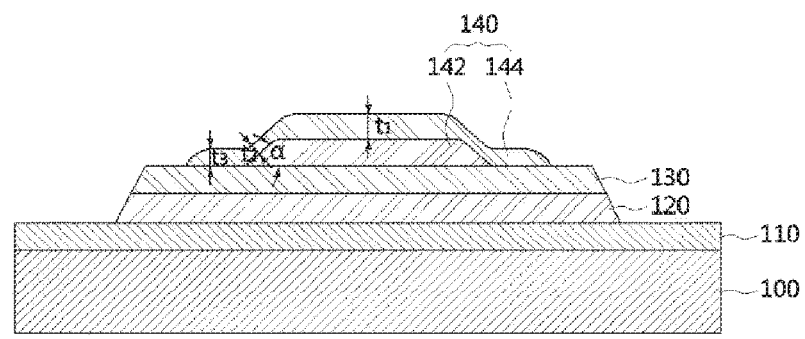
[Fig. 4]
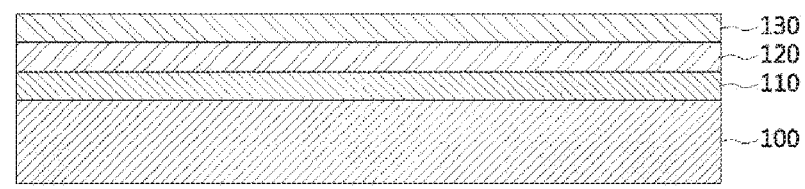

[Fig. 5]
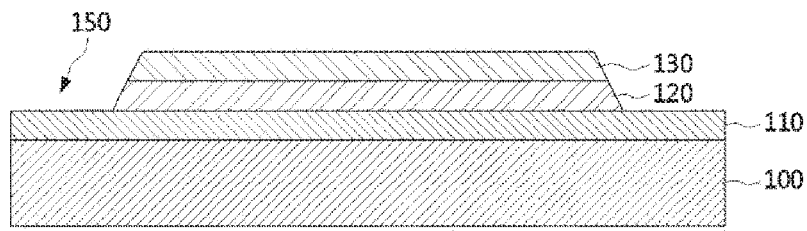
[Fig. 6]
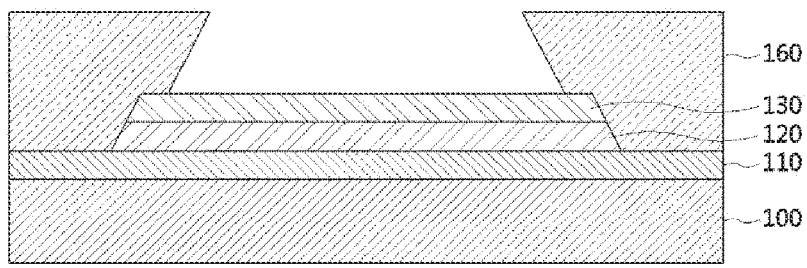
[Fig. 7]
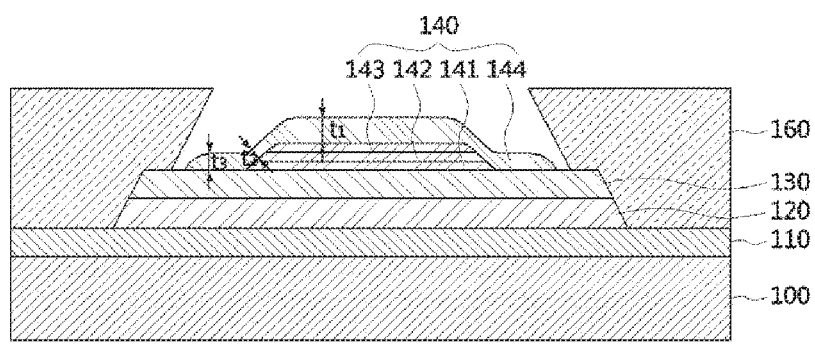
[Fig. 8]
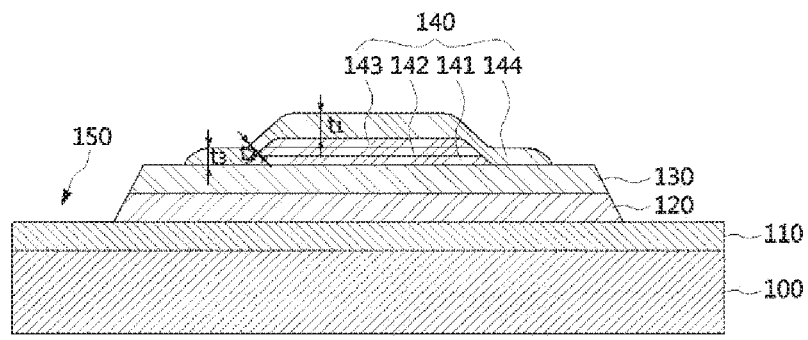

[Fig. 9]
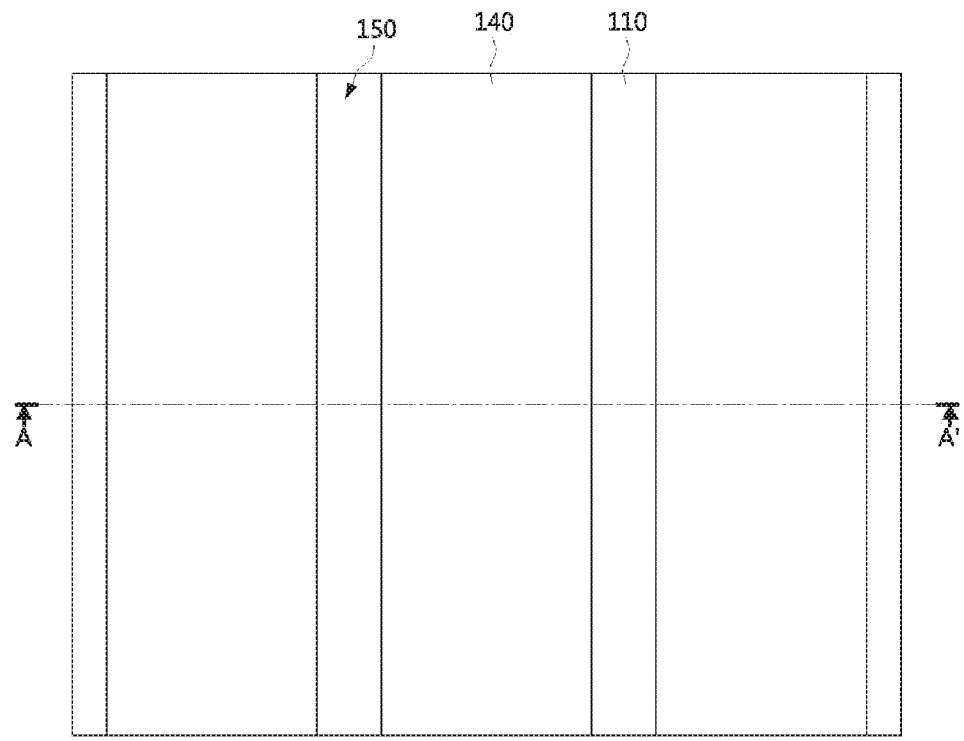
[Fig. 10]
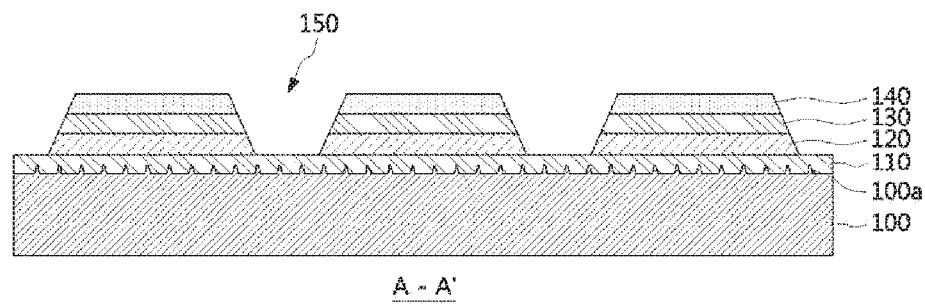

[Fig. 11]
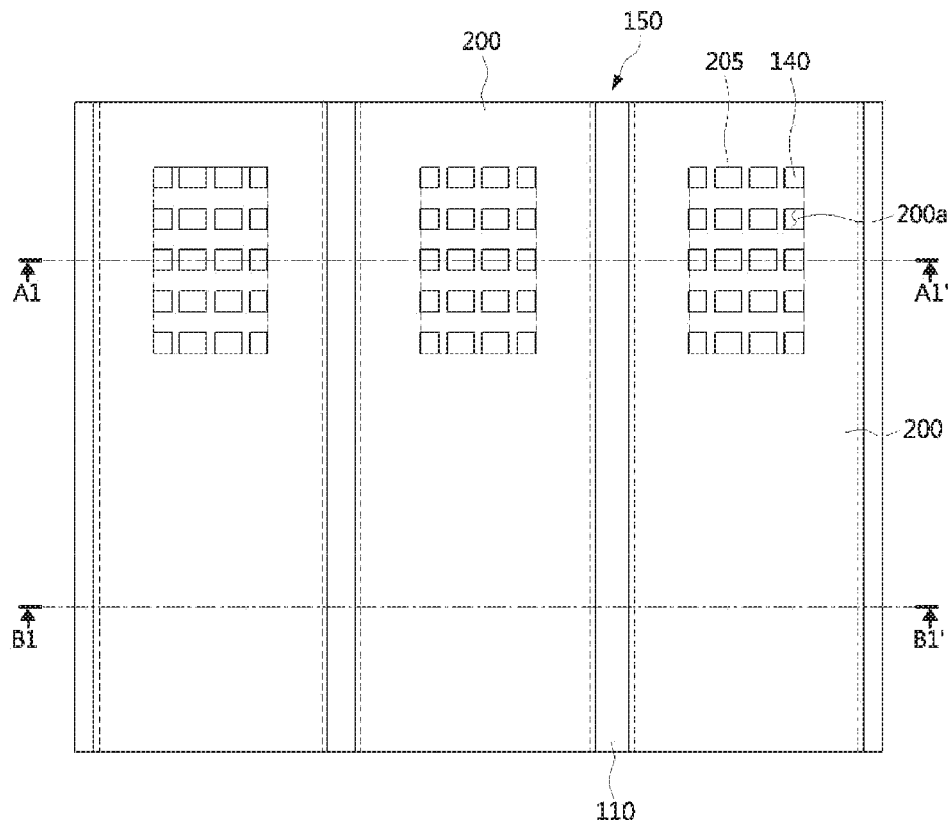
[Fig. 12]
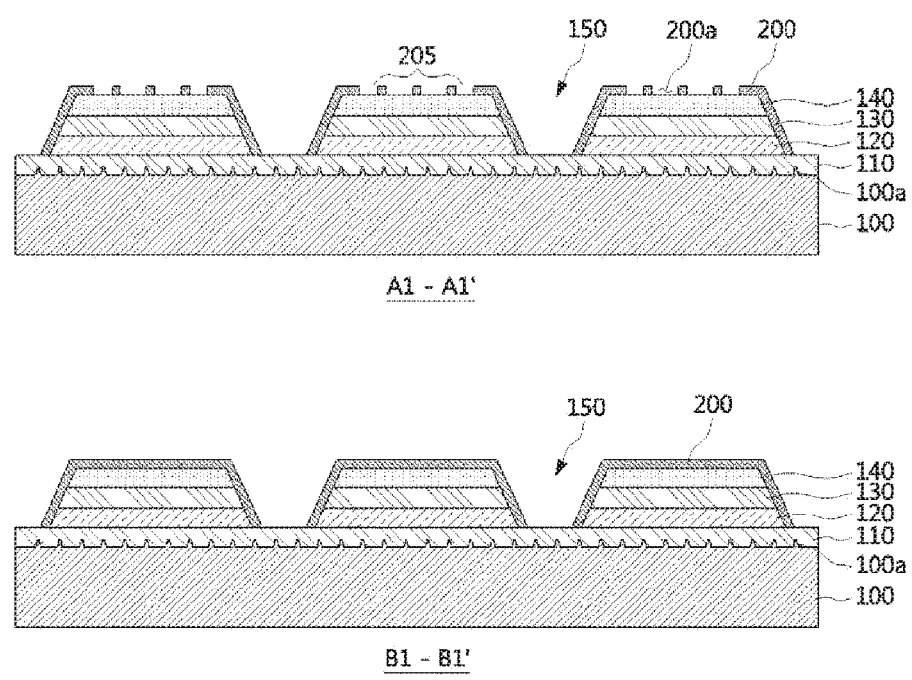

[Fig. 13]
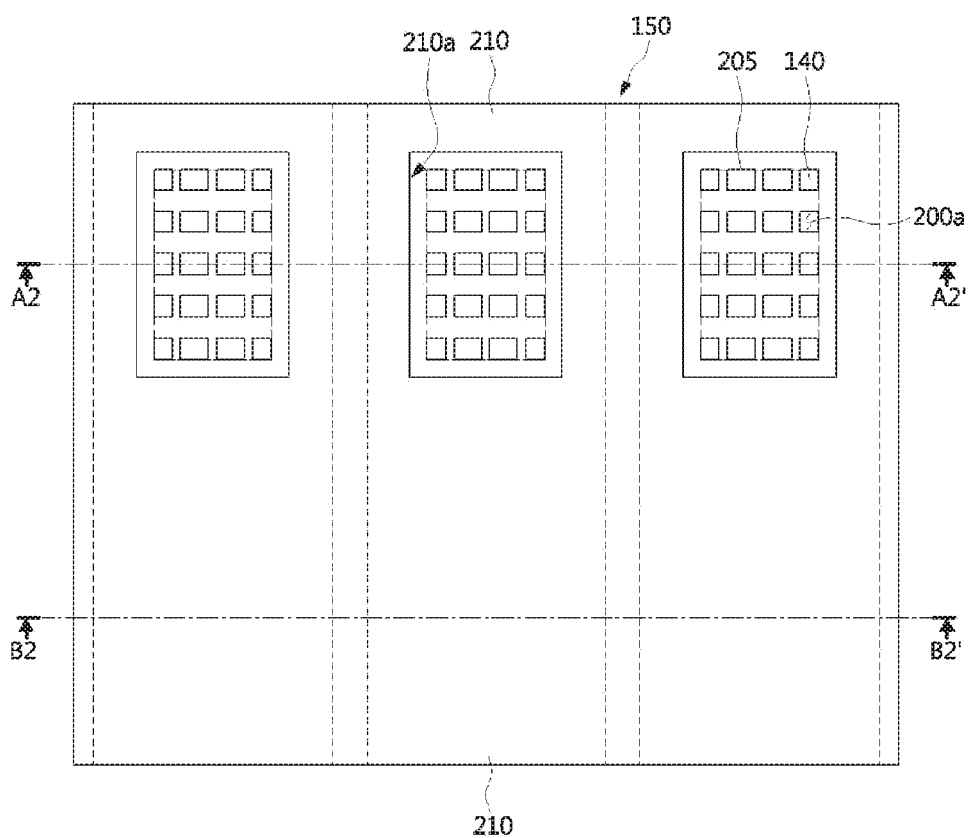

[Fig. 14]
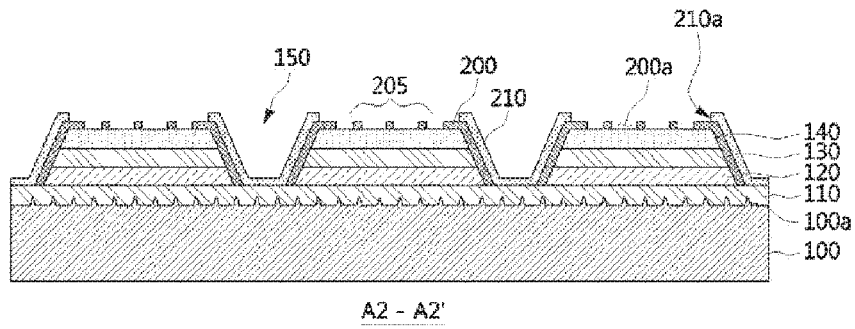
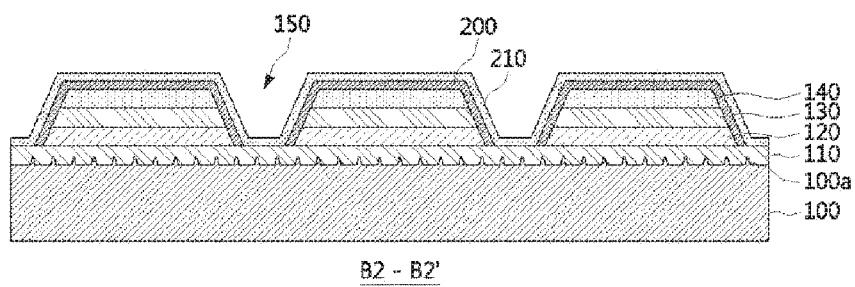
[Fig. 15]
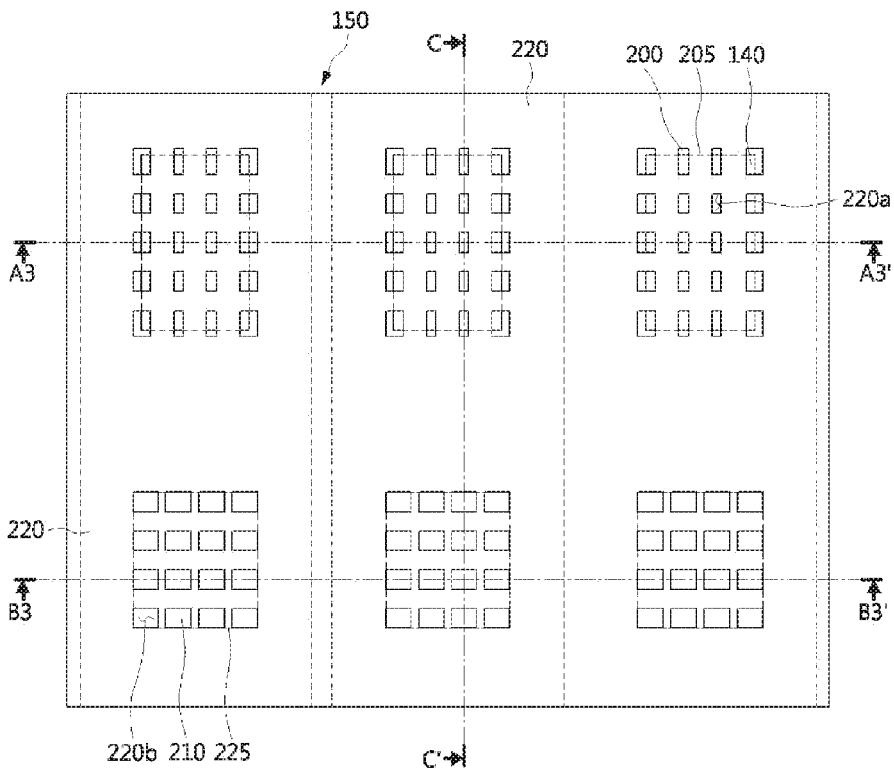

[Fig. 16]
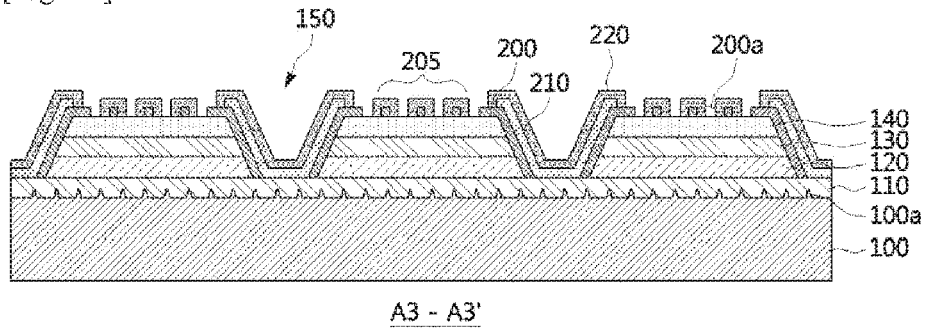
A3 - A3'
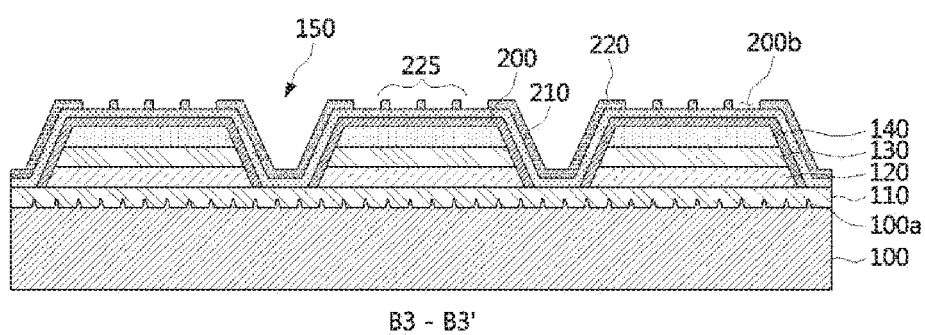
B3 - B3'
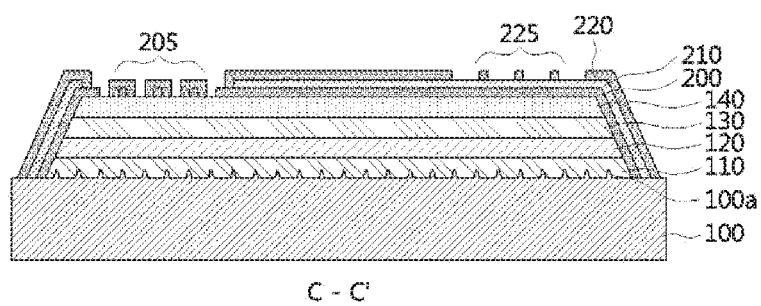
C - C'

[Fig. 17]
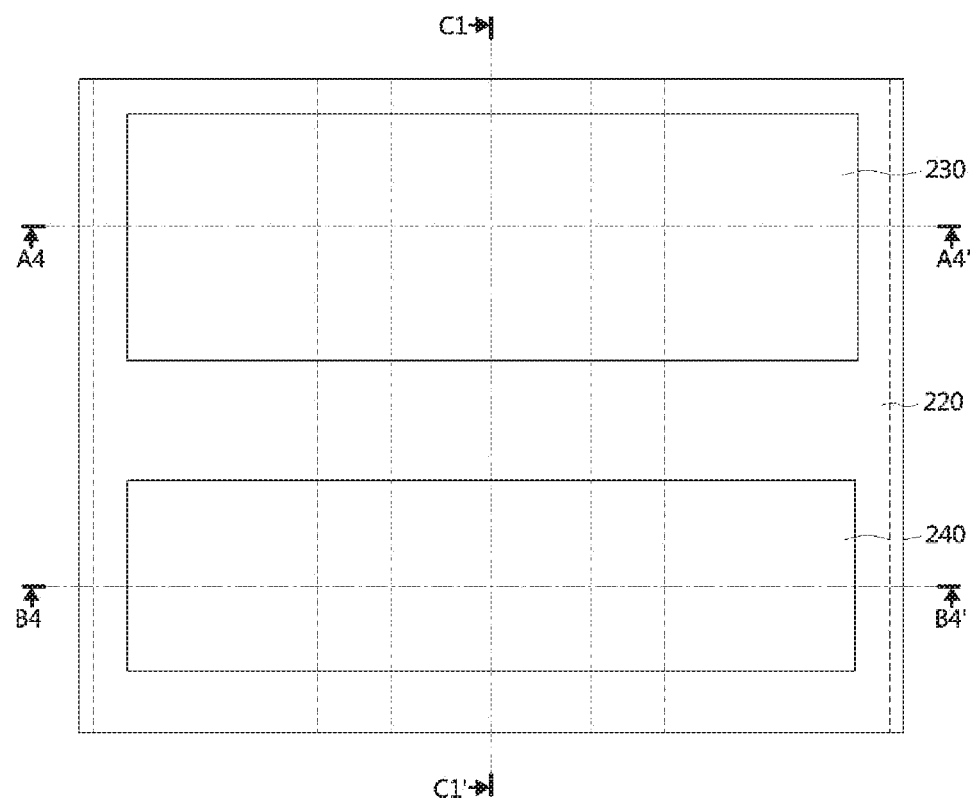

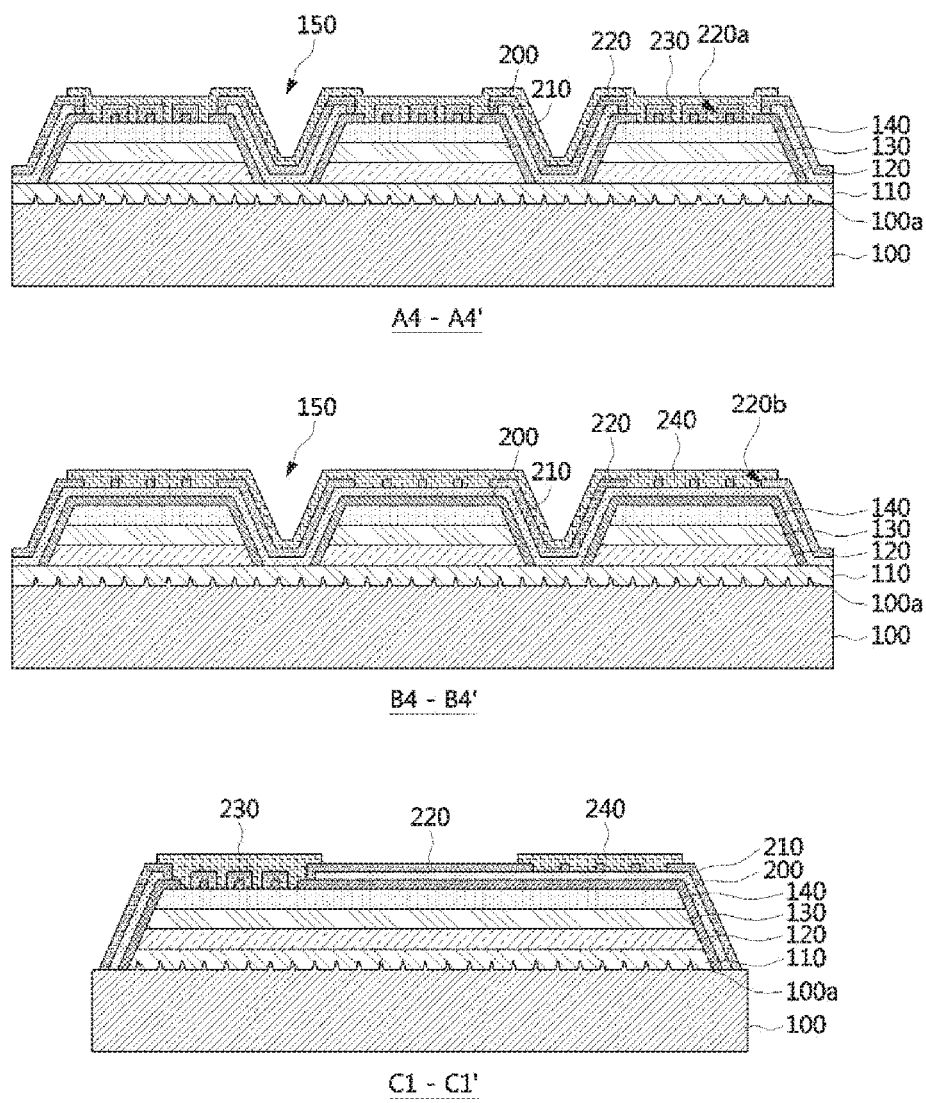
[Fig. 18]

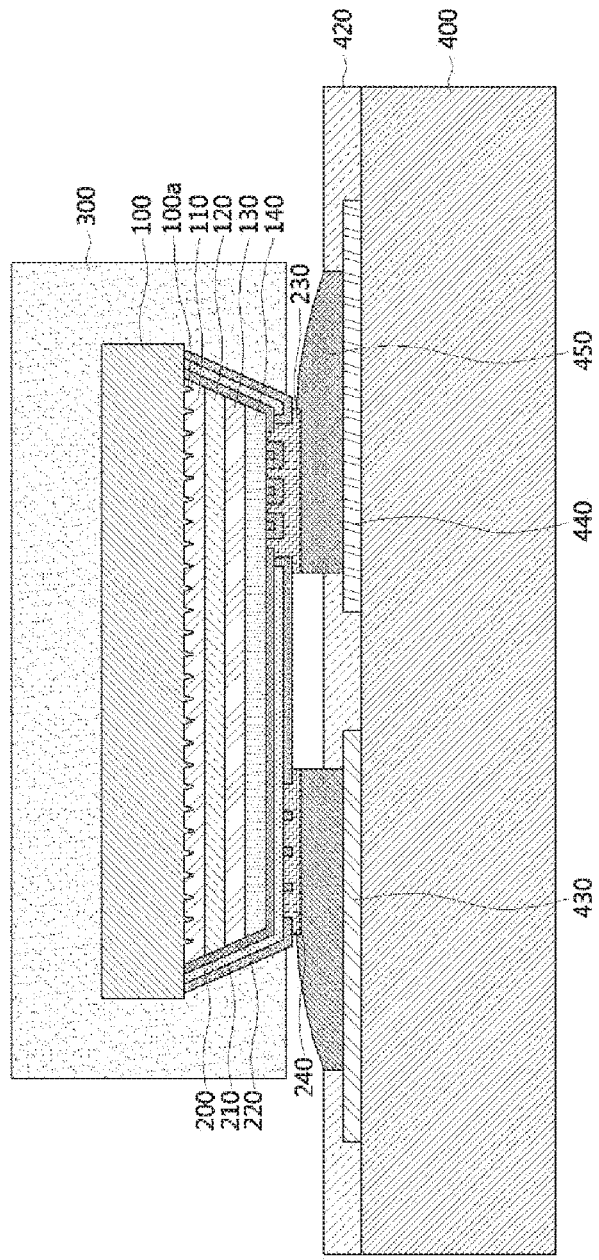

[Fig. 20]
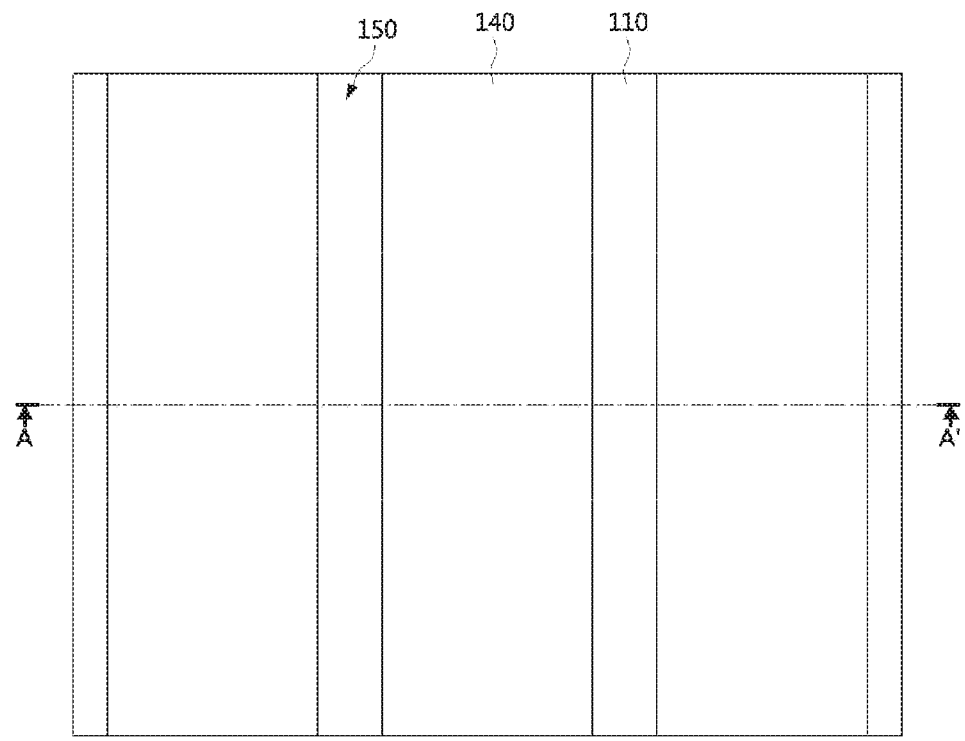
[Fig. 21]
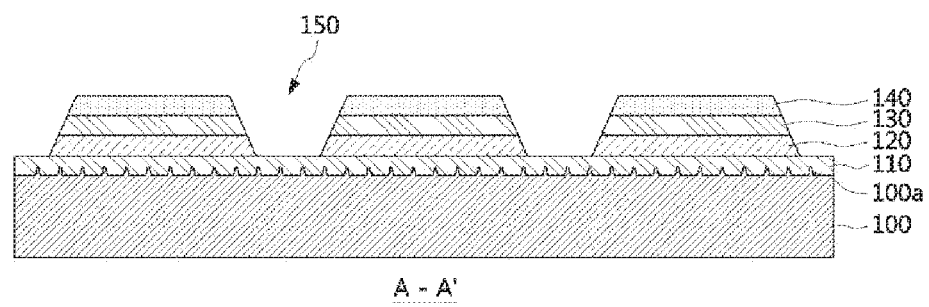

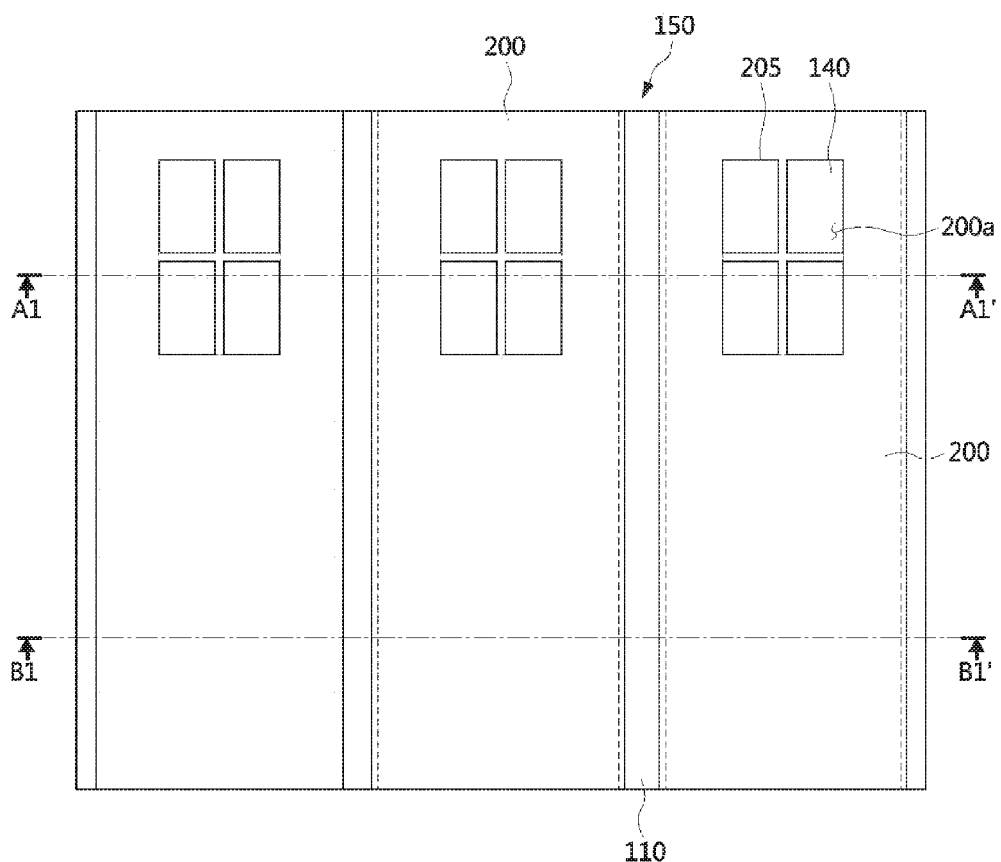
[Fig. 22]

[Fig. 23]
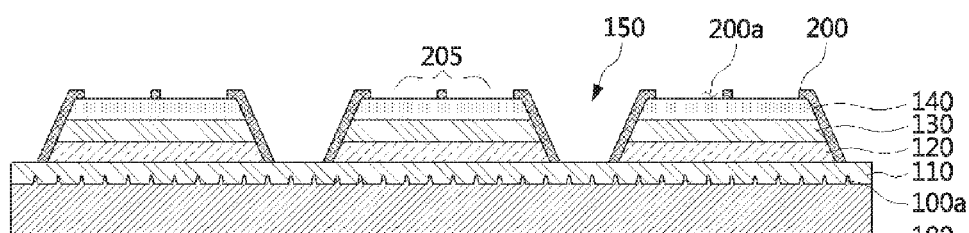
A1 - A1'
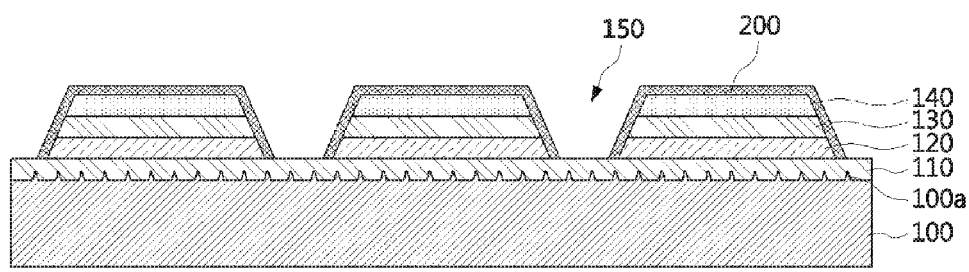
B1 - B1'

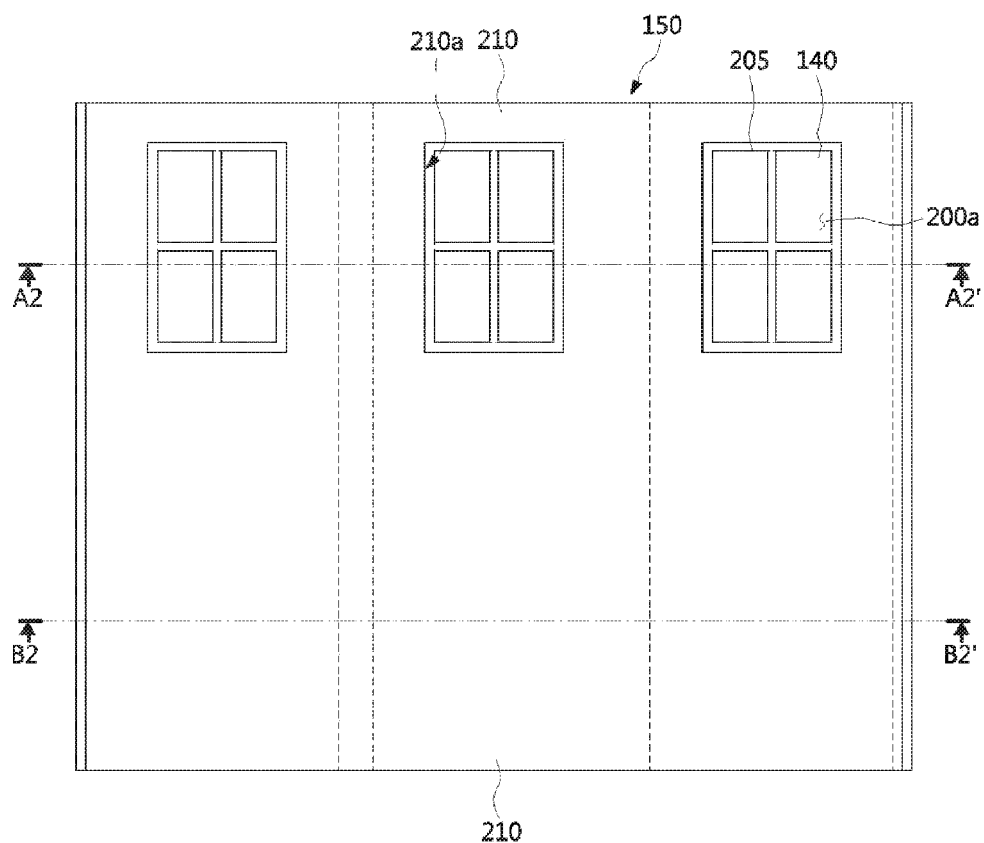
[Fig. 24]

[Fig. 25]
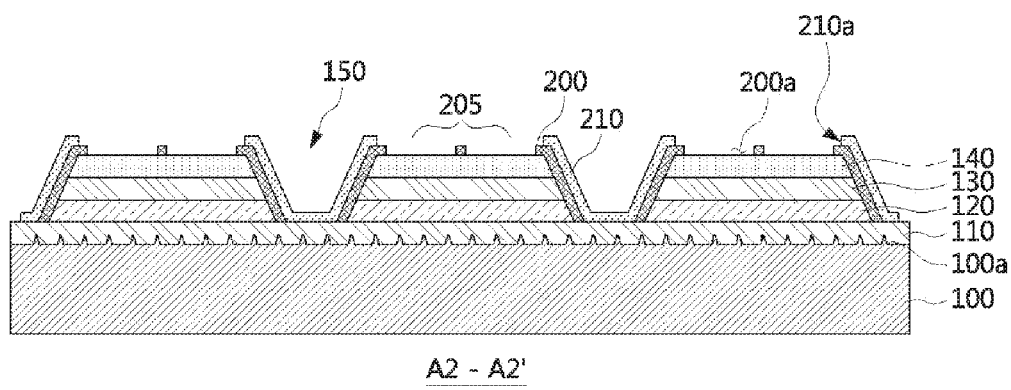
A2 - A2'
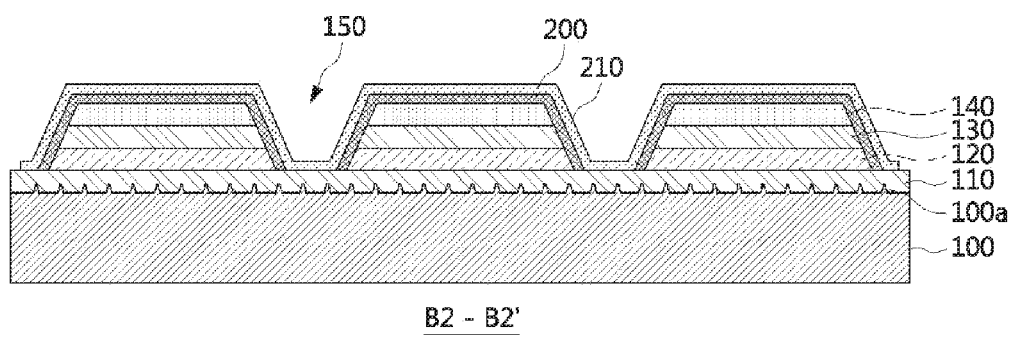
B2 - B2'

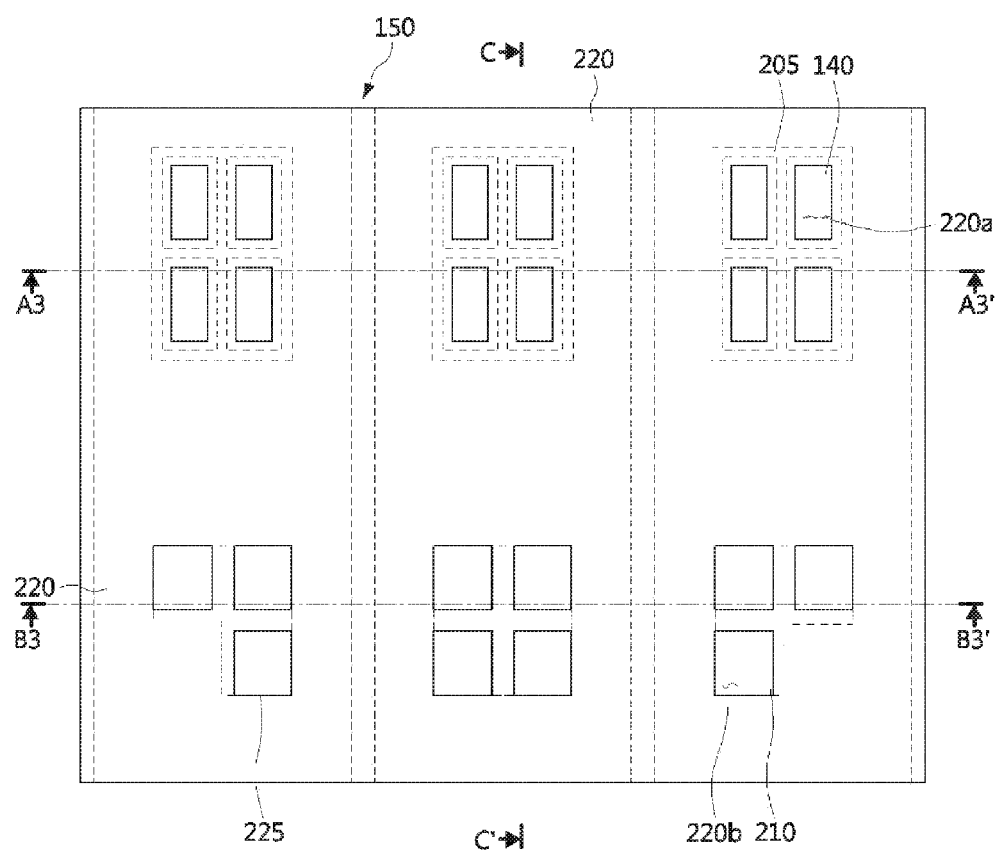
[Fig. 26]

[Fig. 27]
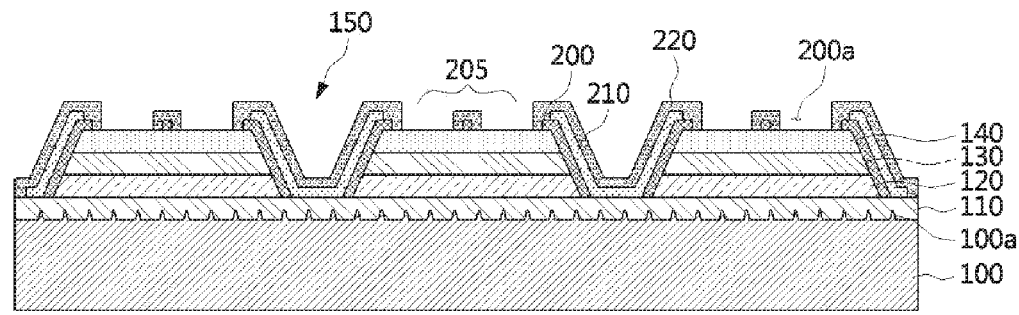
A3 - A3'
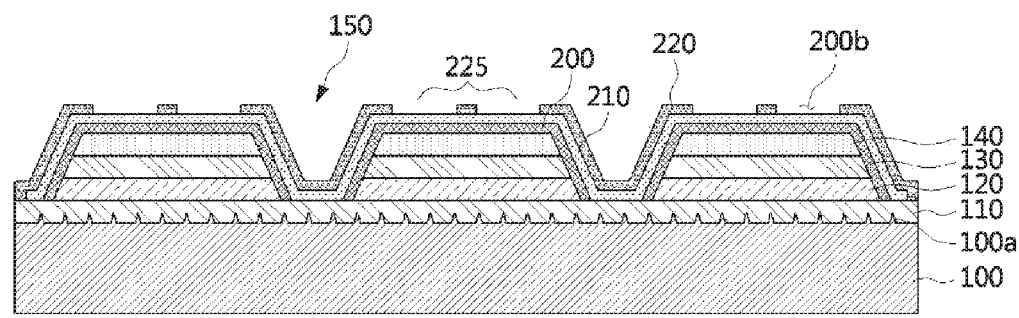
B3 - B3'
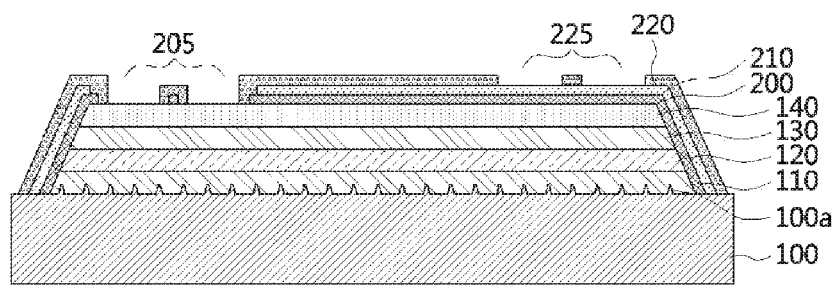
C - C'

[Fig. 28]
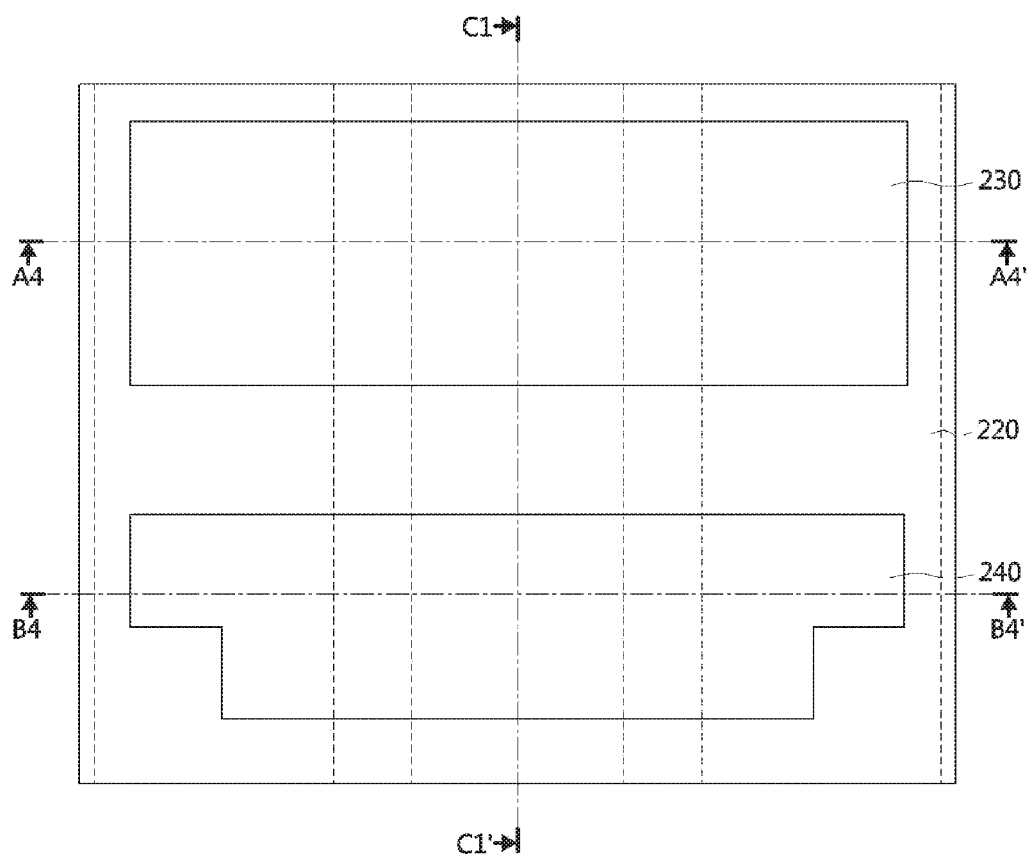

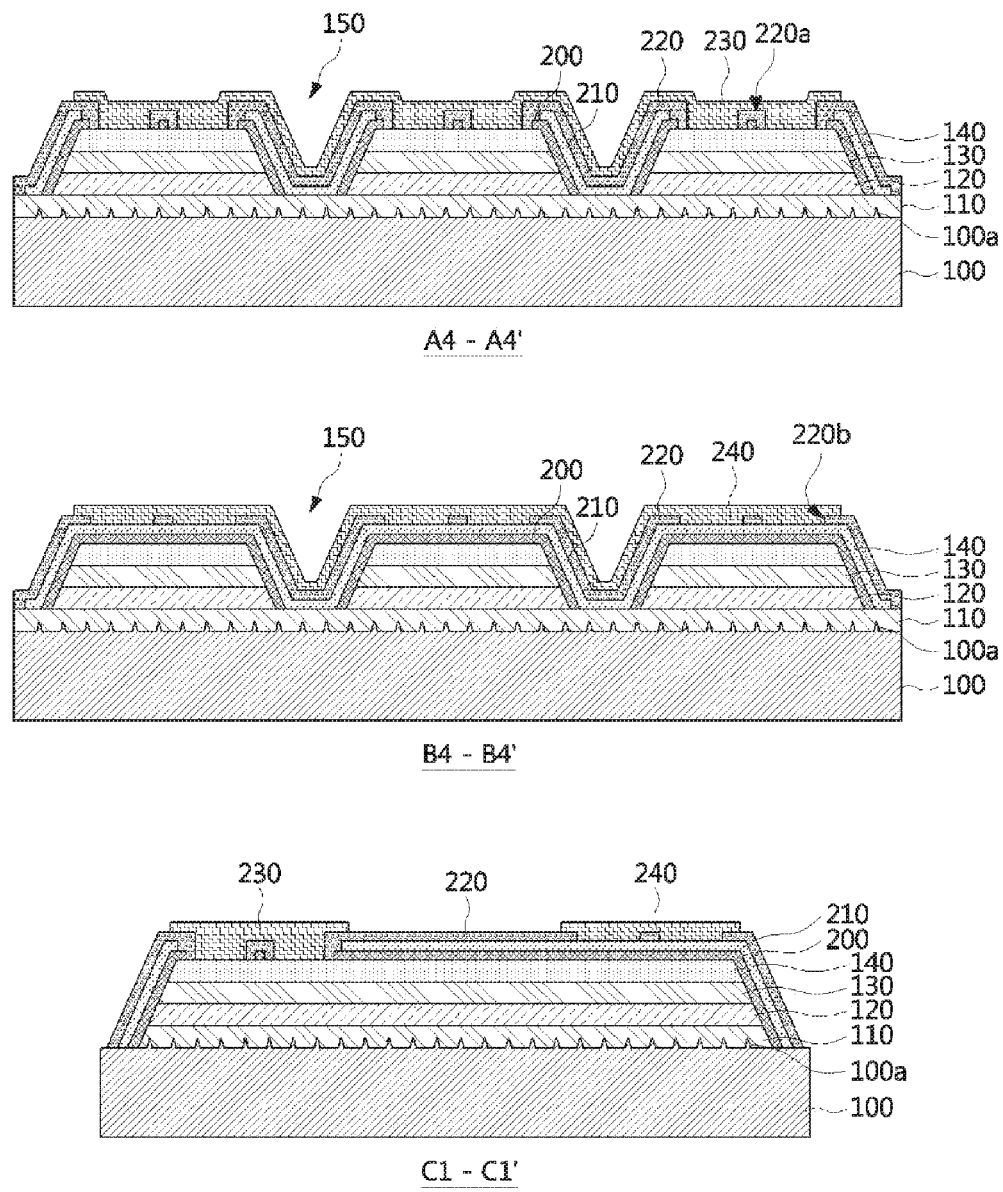

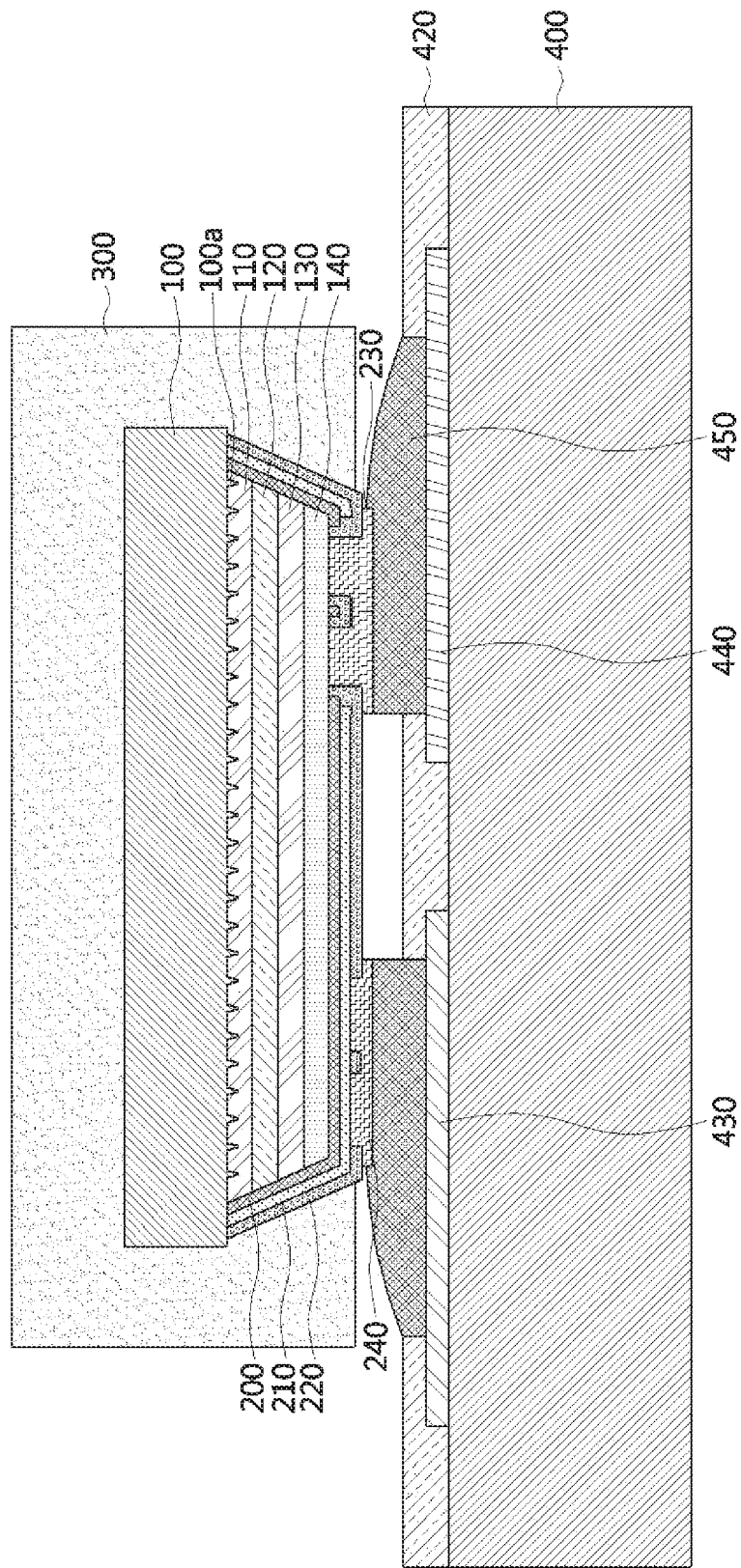
[Fig. 30]

[Fig. 38]
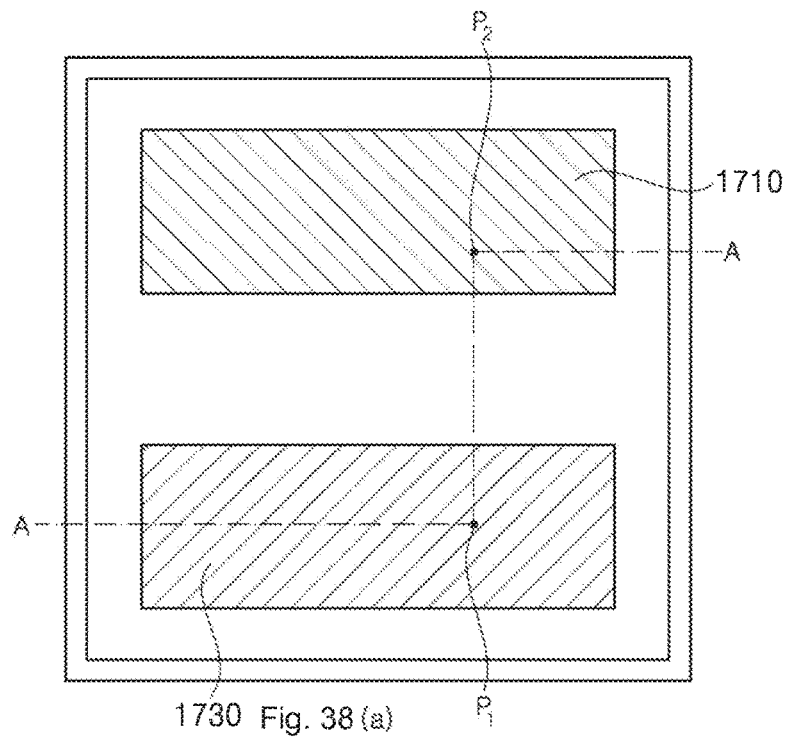
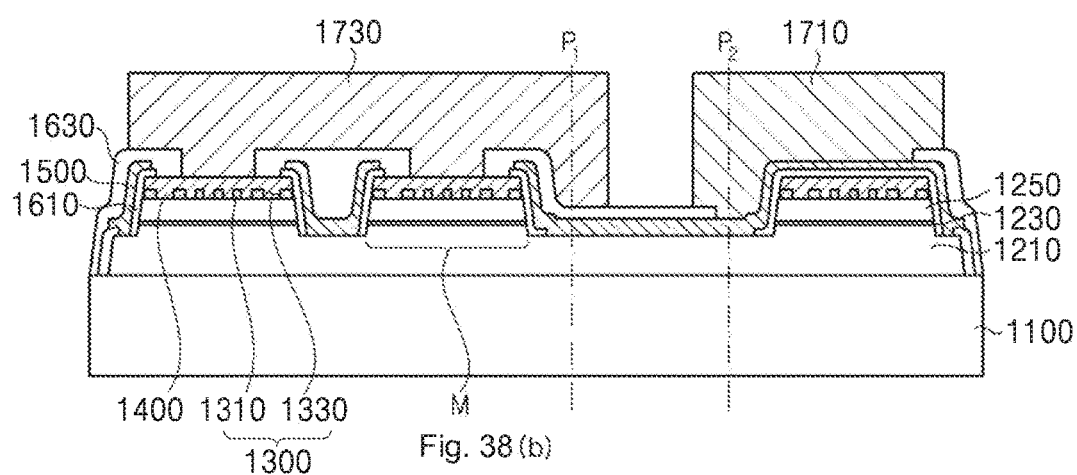

LIGHT EMITTING DIODE MODULE FOR SURFACE MOUNT TECHNOLOGY AND METHOD OF MANUFACTURING THE SAME

PRIORITY CLAIMS AND CROSS-REFERENCES TO RELATED APPLICATION

This patent document is a continuation of, and claims benefits and priorities to U.S. patent application Ser. No. 14/752,413 filed on Jun. 26, 2015, which is a continuation-in-part of U.S. patent application Ser. No. 14/588,878 filed on Jan. 2, 2015, which is a continuation-in-part application under 35 U.S.C. 111(a), 120 and 365(c) and claims priorities to, and benefits of, prior PCT application number PCT/KR2013/005557 filed on Jun. 24, 2013, which further claims priorities to, and benefits of, prior Korean application number 10-2012-0071576 filed on Jul. 2, 2012. This patent document further claims the priority and benefit of prior Korean application number 10-2014-0079218 filed on Jun. 26, 2014. The entire content of the before-mentioned patent applications is incorporated by reference as part of the disclosure of this application.

TECHNICAL FIELD

This patent document relates to a light emitting diode (LED) including a surface-mount LED module and a method of manufacturing the same. For example, the patent document relates to an LED having a structure capable of minimizing leakage current caused by a defect such as potential and a method for manufacturing the same.

BACKGROUND

A light emitting diode (LED) is a device including an n-type semiconductor layer, a p-type semiconductor layer, and an active layer interposed between the n- and p-type semiconductor layers. When a forward electric field is applied to the n- and p-type semiconductor layers, electrons and holes may be injected into the active layer and recombine in the active layer to emit light.

An LED module including a plurality of LEDs is disclosed in, for example, U.S. Patent Publication No. 2011-0127568. The surface-mount LED module includes a p-type pad and an n-type pad formed on a top surface of an LED. However, since the p-type pad is electrically connected to the entire surface of p-GaN exposed by an insulating layer, current crowding may occur.

In addition, depending on the type of a chip, an LED may include a reflection layer. For example, the type of a flip-chip is characterized by emitting light through a substrate. Accordingly, after a semiconductor layer is formed on the substrate, a reflection layer formed of a metal is introduced on the semiconductor layer or a current spreading layer, and light is reflected by the reflection layer. Also, a barrier layer is provided on the reflection layer. The barrier layer is provided to prevent diffusion of the metal forming the reflection layer.

SUMMARY

Examples of implementations of the technology disclosed in this patent document provide, a light emitting diode (LED), a LED module and a method of manufacturing an LED module. In some implementations, the LED module proposed in this patent document makes it possible to reduce current crowding and maintain its reliability.

In one aspect, a light emitting diode (LED) module is provided to include; an LED having a first semiconductor layer, an active layer, a second semiconductor layer, and a reflection pattern formed on a substrate, and including a mesa region formed to expose the first semiconductor layer, a first insulating layer formed on the mesa region exposing a portion of a surface of the first semiconductor layer, patterned on the reflection pattern and configured to form a first pad region, a conductive reflection layer formed on the first insulating layer and the first semiconductor layer exposed in the mesa region, a second insulating layer formed on the conductive reflection layer and configured to form a second pad region exposing a portion of the conductive reflection layer, a first pad formed on the first pad region, and a second pad formed on the second pad region.

In another aspect, a method of manufacturing an LED module is provided. The method may include; coating a first insulating layer on a structure in which a first semiconductor layer, an active layer, a second semiconductor layer, and a reflection pattern are formed on a substrate, forming a first pad region by exposing a portion of the reflection pattern, and exposing the first semiconductor layer disposed on a mesa region, forming a conductive reflection layer on the first insulating layer, electrically connecting the conductive reflection layer to the exposed first semiconductor layer, and maintaining the first pad region in an opened state, coating a second insulating layer on the conductive reflection layer to expose the reflection pattern disposed in the first pad region, and forming a second pad region exposing a portion of the conductive reflection layer electrically connected to the first semiconductor layer, and forming a first pad on the first pad region and forming a second pad on the second pad region.

According to some implementations of the disclosed technology, pads are formed on a patterned pad region during manufacture of light emitting diode (LED) modules. Thus, local current crowding can be prevented. Also, diffusion of metals is prevented due to a reflection barrier layer provided between a conductive reflection layer and the pads. For example, a phenomenon in which a metal forming the conductive reflection layer moves to a second pad and increase the resistivity of the second pad can be prevented. In some implementations, a second semiconductor layer is electrically connected to a first pad. A pad barrier layer is formed on each of the pads. The pad barrier layer prevents diffusion of a metal generated during a bonding or soldering process so that the first pad or the second pad can have a high conductivity and be in electrical contact with the outside.

In some implementations, a phosphor layer may be provided on an LED chip and include a plurality of phosphor layers. Accordingly, an operation of correcting color coordinates is enabled using at least one wavelength conversion operation, and correction of the color coordinates may be simplified by controlling the concentrations of phosphors.

In another aspect, a light emitting diode (LED) is provided to include: a first conductive type semiconductor layer: an active layer positioned over the first conductive type semiconductor layer; a second conductive type semiconductor layer positioned over the active layer; a defect blocking layer including a masking region to cover at least a part of the top surface of the second conductive semiconductor layer and an opening region to partially expose the top surface of the second conductive type semiconductor layer; wherein the active layer and the second conductive type semiconductor layer are disposed to expose a part of the first conductive type semiconductor layer, and the defect blocking layer may include a first region and a second region surrounding the first region, and a ratio of the area of the opening region to the area of the masking region in the first region is different from a ratio of the area of the opening region to the area of the masking region in the second region.

In some implementations, a reflective electrode layer positioned over the second conductive type semiconductor layer so as to form an ohmic contact, and covering at least a part of the defect blocking layer; and a first metal layer forming an ohmic contact with the first conductive type semiconductor layer through the exposed part of the first conductive semiconductor layer.

According to above LED, the probability that a leakage current and static electricity discharge occur can be reduced.

In some implementations, the ratio of the area of the opening region to the area of the masking region in the first region may be greater than the ratio of the area of the opening region to the area of the masking region in the second region.

In some implementations, the defect blocking layer may further include a third region surrounding the second region, and the ratio of the area of the opening region to the area of the masking region in the second region may be greater than the ratio of the area of the opening region to the area of the masking region in the third region.

In some implementations, the defect blocking layer may further include an additional region surrounding the second region, the first region, the second region, and the additional region may be arranged to be concentric and have a polygonal shape, and the ratio of the area of the opening region to the area of the masking region may gradually decrease along an outward direction from the center of the polygonal shape.

In some implementations, the masking region and the opening region of the defect blocking layer may be embossed or engraved.

In some implementations, the opening region may be formed to expose portions of the second conductive type semiconductor layer through a plurality of openings isolated from each other.

In some implementations, the LED further includes a reflective electrode layer positioned over the second conductive type semiconductor layer so as to form an ohmic contact, and covering at least a part of the defect blocking layer. In some implementations, the plurality of openings may be covered by the reflective electrode layer, and the reflective electrode layer forms an ohmic contact with the second conductive type semiconductor layer through the plurality of openings.

In some implementations, the defect blocking layer may be completely covered by the reflective electrode layer.

In some implementations, a part of the masking region may be covered by the reflective electrode layer, and the other part of the masking region covers at least a part of the second conductive type semiconductor layer.

In some implementations, the masking region may include a plurality of masks isolated from each other.

In some implementations, the LED further comprises a reflective electrode layer positioned over the second conductive type semiconductor layer so as to form an ohmic contact, and covering at least a part of the defect blocking layer.

In some implementations, the plurality of masks may be covered by the reflective electrode layer, and the reflective electrode layer may form an ohmic contact with the second conductive type semiconductor layer.

In some implementations, the masking region and the opening region of the defect blocking layer may have a circular pattern or hexagonal pattern.

In some implementations, the defect blocking layer may include an insulating layer.

In some implementations the defect blocking layer may include a distributed Bragg reflector.

In some implementations, the LED may further include a plurality of mesas each including the active layer and the second conductive type semiconductor layer, wherein the exposed part of the first conductive type semiconductor layer is located in the peripheral region of the plurality of mesas.

In some implementations, the first and second regions are arranged in the shape of a concentric rectangle, and the ratio of the area of the opening region to the area of the masking region in the first region is greater than the ratio of the area of the opening region to the area of the masking region in the second region.

In some implementations, the LED may further include a reflective electrode layer positioned over the second conductive type semiconductor layer so as to form an ohmic contact, and covering at least a part of the defect blocking layer, and a lower insulating layer covering the side surfaces of the plurality of mesas and a part of the top surfaces of the plurality of mesas. The lower insulating layer may include a first opening to expose the first conductive type semiconductor layer and a second opening to partially expose the reflective electrode layer.

In some implementations, the LED may further include a first metal layer forming an ohmic contact with the first conductive type semiconductor layer through the exposed pan of the first conductive type semiconductor layer; and an upper insulating layer covering a part of the first metal layer, the side surfaces of the plurality of mesas, and a part of the second opening. The upper insulating layer is disposed to expose the first metal layer through a third opening and partially expose the reflective electrode layer through a fourth opening.

In some implementations, the LED may further include: a first pad forming an ohmic contact with the first metal layer through the third opening; and a second pad forming an ohmic contact with the reflective electrode layer through the fourth opening.

In another aspect, a method for manufacturing an LED is provided to include: forming a first conductive type semiconductor layer, an active layer, and a second conductive type semiconductor layer over a substrate; partially removing the second conductive type semiconductor layer and the active layer, and forming a region which partially exposes the first conductive type semiconductor layer, forming a defect blocking layer including a masking region to cover at least a part of the top surface of the second conductive semiconductor layer and an opening region to partially expose the top surface of the second conductive type semiconductor layer; forming a reflective electrode layer over the second conductive type semiconductor layer, the reflective electrode layer forming form an ohmic contact with the second conductive type semiconductor layer while covering at least a part of the defect blocking layer, and covering 90% or more of the surface of the second conductive type semiconductor layer; and forming a first metal layer over the first conductive type semiconductor layer, the first metal layer forming an ohmic contact with the first conductive type semiconductor layer. The defect blocking layer may include a first region and a second region surrounding the first region, and a ratio of the area of the opening region to the area of the masking region in the first region may be different from a ratio of the area of the opening region to the area of the masking region in the second region.

In some implementations, the second region may be closer to the part at which the first metal layer forms an ohmic contact with the first conductive type semiconductor layer, than the first region. In some implementations, the ratio of the area of the opening region to the area of the masking region in the first region may be greater than the ratio of the area of the opening region to the area of the masking region in the second region.

In some implementations, the defect blocking layer may further include a third region surrounding the second region, the third region being closer to the part at which the first metal layer forms an ohmic contact with the first conductive type semiconductor layer, than the second region. In some implementations, the ratio of the area of the opening region to the area of the masking region in the second region may be greater than the ratio of the area of the opening region to the area of the masking region in the third region.

In some implementations, the defect blocking layer may further include a plurality of regions surrounding the second region, the first region, the second region, and the plurality of regions are arranged in the shape of a concentric polygon around the first region, and the ratio of the area of the opening region to the area of the masking region may gradually decrease along an outward direction from the center of the polygonal shape.

In some implementations, the forming of the defect blocking layer may include forming an insulating layer to cover at least a part of the top surface of the second conductive type semiconductor layer, and forming the opening region and the masking region in an embossed or engraved shape by patterning the insulating layer.

In some implementations, the forming of the insulating layer may include stacking dielectric layers having different refractive indexes.

In some implementations, the defect blocking layer may include a plurality of openings isolated from one another, and the plurality of openings may be filled with the reflective electrode layer.

In some implementations, the defect blocking layer may include a plurality of masks, and the plurality of masks may be covered by the reflective electrode layer.

BRIEF DESCRIPTION OF DRAWINGS

FIG. 1 shows an image of a conventional tight emitting diode (LED) including a reflection layer and a barrier layer are introduced.

FIG. 2 is a cross-sectional view showing a cracked portion of FIG. 1.

FIG. 3 is a cross-sectional view of an exemplary LED unit according to one implementation of the disclosed technology.

FIGS. 4 through 8 are cross-sectional views illustrating an exemplary method of manufacturing the LED unit of FIG. 3 according to one implementation of the disclosed technology.

FIGS. 9 through 18 are plan views and cross-sectional views illustrating a method of manufacturing an LED module including the LED unit of FIG. 3 according to another implementation of the disclosed technology.

FIG. 19 is a cross-sectional view of an LED package according to another implementation of the disclosed technology.

FIGS. 20 through 29 are plan views and cross-sectional views illustrating a method of manufacturing an LED module including the LED unit of FIG. 3 according to another implementation of the disclosed technology.

FIG. 30 is a cross-sectional view of an LED package according to another implementation of the disclosed technology.

FIGS. 31(a) through 38(b) are plan views and cross-sectional views for describing an LED and a method for manufacturing the same according to implementations of the disclosed technology.

DETAILED DESCRIPTION

Figure 31:
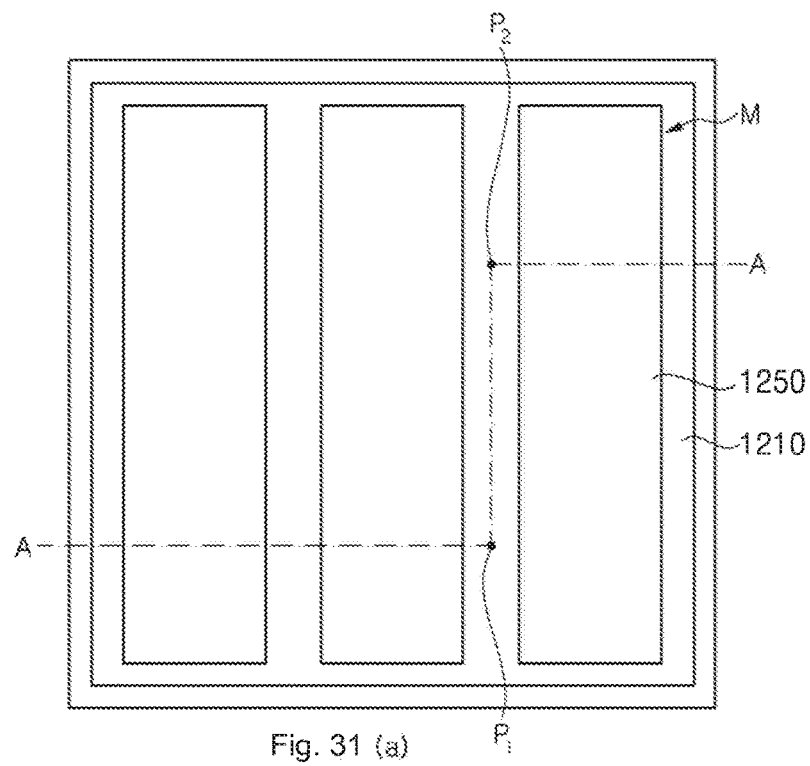
Figure 31:
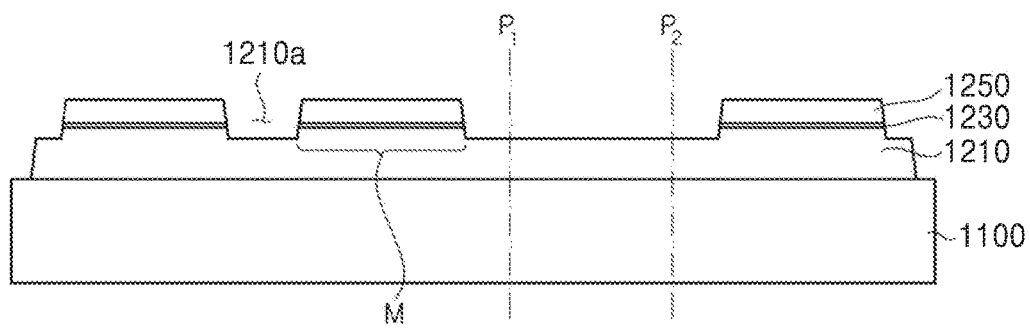

In the conventional flip chip-type LED, the reflection layer is formed to cover most of the p-type semiconductor layer, in order to improve reflection efficiency. However, when the reflection layer is in direct contact with the p-type semiconductor layer, potential existing in the p-type semiconductor layer may come in direct contact with the reflection layer. At this time, a leakage current may occur along the potential which comes in direct contact with the reflection layer. Furthermore, when the leakage current is applied to a part vulnerable to external static electricity, the device may be destroyed by static electricity discharge.

Furthermore, the conventional flip chip-type LED has low current spreading efficiency because the p-type semiconductor layer and the reflection layer are in direct contact with each other. Thus, current crowding may occur in a specific region. When a current crowding region is formed in the semiconductor layer during an operation of the LED, the current crowding region increases the probability that static electricity discharge will occur, because the current crowding region is vulnerable to static electricity.

In order to solve the problem of the conventional flip chip-type LED, a current blocking layer which is interposed between the p-type semiconductor layer and the reflection layer has been suggested. However, when the current blocking layer is additionally introduced, a forward voltage may be increased. Furthermore, when the current blocking layer is positioned without considering a current path, a leakage current or static current discharge may not be efficiently prevented.

Hereinafter, exemplary implementations of the disclosed technology will be described in detail. It should be understood, however, that those implementations are provide as examples and there is no intent to limit the disclosed technology to the implementations disclosed.

It will be understood that when a layer is referred to as being "on" another layer or substrate, it can be directly on the other layer or substrate or intervening layers may also be present. Terms that describe spatial relationships, such as "on," "upper," "top surface," "under," "lower," "bottom surface" and the like, may be used herein for ease of description to describe one element or the relationship to another element(s) or features) as illustrated in the figures. It will be understood that such terms are intended to encompass different orientations of the device in use or operation in addition to the orientations) depicted in the figures.

Certain terms in this patent document such as first, second, etc. are merely used to provide labels for various elements and the labels do not limit the scope of the labeled elements. These labeling terms are only used to distinguish one element from another element, and the labeling terms do not specify an order or a temporal relationship among the labeled elements.

In the drawings, the thicknesses of layers and regions may be exaggerated for clarity. Like reference numerals refer to like elements throughout.

FIG. 1 shows a conventional LED including a reflection layer and a barrier layer.

A reflection layer 20 is formed on a p-type semiconductor layer 10. The reflection layer 20 is formed through an e-beam evaporation process. The e-beam allows metal ions or atoms to have directionality and, a shape of the reflection layer 20 may be determined by an entrance angle of the metal ions or atoms. A side portion of the reflection layer 20 tend to not have a substantially vertical profile with respect to the p-type semiconductor layer 10 and rather forms a predetermined angle with respect to a surface of the p-type semiconductor layer 10. For example, when the reflection layer 20 includes silver (Ag), it is difficult for the reflection layer 20 to have a vertical profile due to inherent diffusivity. Accordingly, it is general to obtain a nearly vertical profile by controlling an angle of a substrate with respect to a direction in which metal ions or atoms proceed from a target.

A barrier layer 30 is introduced on the reflection layer 20. In FIG. 1, the barrier layer 30 has a structure in which two kinds of metal layers are alternately formed. The barrier layer 30 is provided to prevent diffusion of metal atoms of the reflection layer 20. For example, the barrier layer 30 is formed by alternately stacking a Ti layer and a TiW layer. Alternatively, the barrier layer 30 may be obtained by repetitively forming a single kind of metal layer instead of two kinds of metal layers.

The various conditions including diffusion coefficients and thermal expansion coefficients of a metal of the barrier layer 30 that is stacked during the formation of the barrier layer 30 cause the structure of the barrier layer 30 to be spontaneously destroyed or crack. This problem becomes worse as the underlying reflection layer 20 has a profile closer to a vertical profile.

In FIG. 1, on the reflection layer 20 including Ag, a first barrier layer 31 and a second barrier layer 32 are formed to include Ag and titanium tungsten (TiW), respectively. A side surface of the reflection layer 20 forms an angle at a surface of a p-type semiconductor layer 10 exceeding about 45°. The barrier layer 30 is deposited on a profile having a high inclination. The deposition process is generally performed using a sputtering process.

The first barrier layer 31 and the second barrier layer 32 are alternately stacked along the inclined profile. However, as the number of times the first and second barrier layers 31 and 32 are stacked increases and the thickness of the barrier layer 30 increases, the barrier layer 30 is likely to crack in the inclined side surfaces of the reflection layer 20. The cracks occur more frequently if the barrier layer 32 includes two different kinds of metals that are alternately stacked and as the inclination angle of a side profile of the reflection layer 20 increases. FIG. 1 shows a cracked portion 40.

FIG. 2 is a cross-sectional view showing the cracked portion of FIG. 1.

Referring to FIG. 2, as the number of the first barrier layer 31 and the second barrier layer 32 that are alternately formed on side surfaces of the reflection layer 20 increases, the thicknesses of the first and second barrier layers 31 and 32 formed on the side surfaces of the reflection layer 20 decreases, and a phenomenon occurs that the first and second barrier layers 31 and 32 are not any longer deposited on the side surfaces of the reflection layer 20. Accordingly, a portion is formed along the barrier layer 30, in which the first barrier layer 31 or the second barrier layer becomes discontinuous. Thus, a crack occurs in the barrier layer 30. The crack occurred in the barrier layer 30 cause metal atoms of the reflection layer 20 to diffuse. Accordingly, as heterogeneous metals are introduced in a subsequent process including forming an electrode, electrical properties are degraded.

The causes why the crack portion is formed as shown in FIGS. 1 and 2 may be analyzed in various approaches.

For example, the barrier layer 30 may be formed near a top surface of the reflection layer 20 to have a relatively great thickness, while the barrier layer 30 may be formed on side surfaces of the reflection layer 20 to have a relatively small thickness. When this phenomenon continues or worsens, a discontinuous portion is formed in the first barrier layer 31 or the second barrier layer 32.

Furthermore, cracks may occur in a specific barrier layer due to a difference in coefficient of thermal expansion between two kinds of metal materials during the deposition of the two kinds of metal materials. The cracks in the first barrier layer 31 or the second barrier layer 32 are not cured during a subsequent deposition process, and the cracks occur more frequently as a deposition process proceeds. It can be seen from FIG. 1 that a crack or discontinuity is more serious toward an upper portion of the cracked portion 40.

Cracks formed in a barrier layer adversely affect characteristics of an LED. For example, metal atoms may diffuse from a reflection layer, thereby degrading electrical properties. Also, since an LED has a stacked structure of multiple layers, cracks in the barrier layer become worse depending on the environment in which an LED is used. The cracks in the barrier layer fatally affect the reliability of the LED.

Furthermore, when a surface-mount LED module is manufactured using the above described LED with cracks, local crowding of current supplied from a pad occurs due to the cracks in the barrier layer. For instance, even if a high voltage or current is applied to increase luminance, since the current crowds in a p-GaN layer, luminance is reduced.

FIG. 3 is a cross-sectional view of an exemplary light emitting diode (LED) unit provided according to one implementation of the disclosed technology.

Referring to FIG. 3, a first semiconductor layer 110, an active layer 120, a second semiconductor layer 130, and a reflection pattern 140 are formed on a substrate 100.

The substrate 100 may be formed of or include any material capable of inducing the first semiconductor layer 110 to be grown. Accordingly, the substrate 100 may include sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon. In one implementation, the substrate 100 may be or include a sapphire substrate.

Also, the substrate 100 may be or include a substrate on which surface treatment is not performed. The substrate 100 may be patterned. Also, a surface of the substrate 100 may have a moth-eye structure. For example, the substrate 100 may have a protrusion protruding in a roughly hemispherical shape, and pointed structures may be densely disposed on the protrusion.

The first semiconductor layer 110 is formed on the substrate 100. As one example, the first semiconductor layer 110 has an n conductivity type.

The active layer 120 may be formed on the first semiconductor layer 110. The active layer 120 may have a single quantum well (SQW) structure in which a well layer and a barrier layer are stacked, or a multi-quantum well (MQW) structure in which well layers and barrier layers are alternately stacked.

The second semiconductor layer 130 is formed on the active layer 120. As one example, the second semiconductor layer 130 has a p conductivity type.

The first semiconductor layer 110, the active layer 120, and the second semiconductor layer 130 may include Si, GaN, AlN, InGaN, or AlInGaN. When the first semiconductor layer 110 includes GaN, the active layer 120 and the second semiconductor layer 130 include GaN. However, since the second semiconductor layer 130 has a complementary conductivity type to the first semiconductor layer 110, a different dopant from that of the first semiconductor layer 110 is introduced into the second semiconductor layer 130. For example, when a dopant serving as a donor is introduced into the first semiconductor layer 110, a dopant serving as an acceptor is introduced into the second semiconductor layer 130. Also, the active layer 120 may include a material on which bandgap engineering is performed to form a barrier layer and a well layer.

The reflection pattern 140 is formed on the second semiconductor layer 130.

The reflection pattern 140 includes a reflective metal layer 142 and a conductive barrier layer 144. In some implementations, an ohmic contact layer (not shown) may be formed under the reflective metal layer 142, and a stress relaxation layer (not shown) may be formed between the reflective metal layer 142 and the conductive barrier layer 144.

An ohmic contact layer may be formed of or include any material capable of enabling ohmic contact between the reflective metal layer 142 and the second semiconductor layer 130. Accordingly, the ohmic contact layer may include a metal including nickel (Ni) or platinum (Pt) or include a conductive oxide, such as indium tin oxide (ITO) or zinc oxide (ZnO). In some implementations, the ohmic contact layer may be omitted.

If the ohmic contact layer is provided, the reflective metal layer 142 is formed on the ohmic contact layer. The reflective metal layer 142 reflects light generated in the active layer 120. Accordingly, the reflective metal layer 142 is formed with a material having conductivity and high optical reflectance. The reflective metal layer 142 includes silver (Ag), a Ag alloy, aluminum (Al), or an Al alloy.

In some implementations, a stress relaxation layer may be formed on the reflective metal layer 142. The stress relaxation layer may have a coefficient of thermal expansion equal to or higher than that of the conductive barrier layer 144, and equal to or lower than that of the reflective metal layer 142. Thus, stress caused due to a difference in coefficient of thermal expansion between the reflective metal layer 142 and the conductive barrier layer 144 may be reduced. Accordingly, a material used for the stress relaxation layer may be selected depending on materials used for the reflective metal layer 142 and the conductive barrier layer 144.

As discussed above, the ohmic contact layer or the stress relaxation layer may be omitted according to various implementations of the disclosed technology.

An angle α that the reflective metal layer 142 forms with respect to a surface of the underlying second semiconductor layer 130 may range from about 5° to about 45°. When an angle α formed by a side surface of the reflective metal layer 142 is less than about 5°, it is difficult to secure a sufficient thickness of the reflective metal layer 142. When the angle α formed by the side surface of the reflective metal layer 142 is more than about 45°, cracks occur in a side profile of the conductive barrier layer 144 formed on the reflective metal layer 142. When an ohmic contact layer is introduced, an inclination angle that the ohmic contact layer forms with respect to the side surface of the reflective metal layer 142 may have the same range as that between the reflective metal layer 142 and the second semiconductor layer 130.

The conductive barrier layer 144 is formed on the reflective metal layer 142 or the stress relaxation layer 143. For example, when the stress relaxation layer 143 is omitted, the conductive barrier layer 144 is formed on the reflective metal layer 142, and when the stress relaxation layer 143 is formed, the conductive barrier layer 144 is formed on the stress relaxation layer 143. The conductive barrier layer 144 is formed to surround at least the side surface of the reflective metal layer 142 and surround top and side surfaces of the stress relaxation layer 143. Accordingly, diffusion of metal atoms or tons of the reflective metal layer 142 is prevented. Also, stress caused due to a difference in coefficient of thermal expansion between the conductive barrier layer 144 and the reflective metal layer 142 may be absorbed in the stress relaxation layer 143. In particular, the conductive barrier layer 144 may be formed to have a different thickness depending on a surface state of the underlying layer that may be the reflective metal layer 142 or stress relaxation layer 143. For example, assuming that the thickness of the conductive barrier layer 144 formed on a top surface of the reflective metal layer 142 or the stress relaxation layer 143 is t1, the thickness of the conductive barrier layer 144 formed on the side surface of the reflective metal layer 142 is t2, and the thickness of the conductive barrier layer 144 formed on the surface of the second semiconductor layer 130 is t3, a relationship of t1<t3<t2 is set.

In addition, the conductive barrier layer 144 is formed to completely shield or cover the uppermost layer of the reflection pattern 140, for example, the reflective metal layer 142 or the stress relaxation layer 143, and extend to the surface of the second semiconductor layer 130.

In addition, when the reflective metal layer 142 includes Al or an Al alloy, and the conductive barrier layer 144 includes W, TiW, or Mo, the stress relaxation layer 143 may be a single layer formed of or including Ag, Cu, Ni, Pt, Ti, Rh, Pd, or Cr, or a combination formed of or including Cu, Ni, Pt, Ti, Rh, Pd or Au. Also, when the reflective metal layer 142 includes Al or an Al alloy, and the conductive barrier layer 144 includes Cr, Pt, Rh, Pd, or Ni, the stress relaxation layer 143 may be a single layer formed of or including Ag or Cu, or a combination formed of or including Ni, Au, Cu, or Ag.

Furthermore, when the reflective metal layer 142 includes Ag or a Ag alloy, and the conductive barrier layer 144 includes W, TiW, or Mo, the stress relaxation layer 143 may be a single layer formed of or including Cu, Ni, Pt, Ti, Rh, Pd, or Cr, or a combination formed of or including Cu, Ni, Pt, Ti, Rh, Pd, Cr, or Au. Also, when the reflective metal layer 142 includes Ag or a Ag alloy, and the conductive barrier layer 144 includes Cr or Ni, the stress relaxation layer 143 may be a single layer formed of or including Cu, Cr, Rh, Pd, TiW, or Ti, or a combination formed of or including Ni, Au, or Cu.

In addition, the conductive barrier layer 144 extends over the surface of the second semiconductor layer 130.

FIGS. 4 through 8 are cross-sectional views illustrating an exemplary method of manufacturing the LED unit of FIG. 3 according to one implementation of the disclosed technology.

Referring to FIG. 4, a first semiconductor layer 110, an active layer 120, and a second semiconductor layer 130 are sequentially formed on a substrate 100.

The substrate 100 may include sapphire (Al2O3), silicon carbide (SiC), gallium nitride (GaN), indium gallium nitride (InGaN), aluminum gallium nitride (AlGaN), aluminum nitride (AlN), gallium oxide (Ga2O3), or silicon. In one implementation, the substrate 100 may be a sapphire substrate. Also, the substrate 100 may be patterned or have a surface with a moth-eye structure.

The first semiconductor layer 110 is provided on the substrate 100. As one example, the first semiconductor layer 110 has an n conductivity type.

In addition, the active layer 120 formed on the first semiconductor layer 110 may have an SQW structure in which a well layer and a barrier layer are stacked, or an MQW structure in which well layers and barrier layers are alternately slacked.

The second semiconductor layer 130 is provided on the active layer 120. As one example, the second semiconductor layer 130 has a p conductivity type.

Materials and structures of the first semiconductor layer 110, the active layer 120, and the second semiconductor layer 130 are the same as those described with reference to FIG. 3, and thus detailed descriptions are omitted.

In addition, the first semiconductor layer 110, the active layer 120, and the second semiconductor layer 130 are formed using an epitaxial growth process. Accordingly, the first semiconductor layer 110, the active layer 120, and the second semiconductor layer 130 may be formed using an MOCVD process.

Referring to FIG. 5, portions of the active layer 120 and the second semiconductor layer 130 are removed using an etching process. Thus, portions of the first semiconductor layer 110 are exposed. In one implementation, after the etching process, selective portions of a top surface of the first semiconductor layer 110 are exposed, and side surfaces of the active layer 120 and the second semiconductor layer 130 are exposed. Through the etching process of removing portions of the active layer 120 and the second semiconductor layer 130, a trench or a hole may be formed. A mesa region 150 is formed in FIG. 5 by etching from the surface of the second semiconductor layer 130 to the surface of the first semiconductor layer 110. The mesa region 150 may be or include a stripe type having a trench shape or a hole type.

When the mesa region 150 has the stripe type, the mesa region 150 may have a vertical profile or inclined profile with respect to the surface of the first semiconductor layer 110. In one implementation, the mesa region 150 has a profile inclined at an angle of about 20° to about 70° with respect to the surface of the first semiconductor layer 110. When the mesa region 150 has a hole type having a roughly circular shape, the mesa region 150 may have a vertical profile or inclined profile with respect to the surface of the first semiconductor layer 110. In one implementation, the mesa region 150 has a profile inclined at an angle of about 20° to about 70° with respect 10 the surface of the first semiconductor layer 110. If the mesa region 150 is inclined at an angle of less than 20°, the mesa region 150 has a greatly increased width in the upper portion of the mesa region 150. In this case, since the structure of the mesa region 150 allows the generated light to emit, convergence of the generated light is degraded. If the mesa region 150 is inclined at an angle of more than 70°, the mesa region 150 has a nearly vertical profile. In this case, the sidewalls of layers do not effectively reflect the generated light as compared to the inclined sidewalls.

Referring to FIG. 6, a photoresist pattern 160 is formed on the exposed portion of the first semiconductor layer 110, which form a bottom surface of the mesa region. The photoresist pattern 160 may have a vertical profile with respect to the surface of the first semiconductor layer 110. In some implementations, the photoresist pattern 160 may be formed to have an overhang structure having a bottom surface with a smaller width than a top surface thereof. In one implementation, the photoresist pattern 160 may have a negative type. Accordingly, exposed portions are cross-linked. To form the overhang structure, the photoresist pattern 160 is exposed while being inclined at a predetermined angle. In the case of the overhang structure, a distance between bottom surfaces of the photoresist patterns 160 may be greater than or equal to a distance between top surfaces of the photoresist patterns 160. In one implementation, the difference between the distances on the bottom and top surfaces of the photoresist patterns 160 may be at least about 1 μm.

Furthermore, the photoresist pattern 160 may be provided to cover a portion of the surface of the second semiconductor layer 130. Accordingly, the portion of the lop surface of the second semiconductor layer 130 may remain shielded or covered by the photoresist pattern 160.

Next, a reflection pattern 140 is formed to include a reflective metal layer 142 and a conductive barrier layer 144 that are sequentially stacked on the second semiconductor layer 130. As discussed above, in some implementations, an ohmic contact layer 141 may be formed under the reflective metal layer 142, and a stress relaxation layer 143 may be formed between the reflective metal layer 142 and the conductive barrier layer 144. In FIG. 7, as one example, the reflection pattern 140 is shown to include the ohmic contact layer 141, the reflective metal layer 142, the stress relaxation layer 143 and the conductive barrier layer 144.

The reflective metal layer 142 includes Al, an Al alloy, Ag, or a Ag alloy, the reflective metal layer 142 may be formed using a metal deposition process. In one implementation, the reflective metal layer 142 is formed using an electronic beam (e-beam) evaporation process capable of moving most metal atoms or ions onto the surface of the second semiconductor layer 130 in a vertical direction. Thus, the metal atoms or ions which have anisotropic etching characteristics may enter a space between the photoresist patterns 160 to form the reflective metal layer 142.

In some implementations, the reflective metal layer 142 has a thickness of about 100 nm to about 1 μm. When the reflective metal layer 142 has a thickness of less than about 100 nm, light generated in the active layer 120 is not smoothly reflected. Also, when the reflective metal layer 142 has a thickness of more than about 1 μm, process loss may occur due to an excessive process time.

In some implementations, if the ohmic contact layer 141 is provided, the ohmic contact layer 141 may be formed before forming the reflective metal layer 142. The ohmic contact layer 141 may include Ni, Pt, ITO, or ZnO. In one implementation, the ohmic contact layer 141 may be formed to have a thickness of about 0.1 nm to about 20 nm. When the ohmic contact layer 141 has a thickness of less than about 0.1 nm, sufficient ohmic characteristics cannot be ensured due to a very small thickness. When the ohmic contact layer 141 has a thickness of more than about 20 nm, the amount of light transmitted is reduced, and the amount of light reflected by the reflective metal layer 142 is reduced.

In some implementations, the stress relaxation layer 143 is formed on the reflective metal layer 142.

In this ease, the stress relaxation layer 143 may be formed using a metal deposition process. In one implementation, the stress relaxation layer 143 may be formed using an e-beam evaporation method having high directionality during a deposition process. That is, metal atoms or ions evaporated by e-beams may have directionality and anisotropy in a space between the photoresist patterns 160. In one implementation, the stress relaxation layer 143 may be formed of or include a metal layer. Also, the stress relaxation layer 143 may have a thermal expansion coefficient that is lower than the reflective metal layer 142 and higher than the conductive barrier layer 144 of FIG. 3, Accordingly, a material of the stress relaxation layer 143 may be selected depending on materials of the reflective metal layer 142 and the conductive barrier layer 144.

When the reflective metal layer 142 and the stress relaxation layer 143 are formed using an e-beam evaporation method, a side surface of the reflective metal layer 142 and a side surface of the stress relaxation layer 143 are exposed. In some implementations, the reflective metal layer 142 and the stress relaxation layer 143 corresponding to an open upper region of the photoresist pattern 160 are formed using an anisotropic deposition process.

In an e-beam evaporation process, upper layers formed by the e-beam evaporation process are formed along a profile of a side surface of the stress relaxation layer 143 such that the upper layers are provided to cover or shield underlying layers. In one implementation, a side surface of a structure including the stress relaxation layer 143 or the reflective metal layer 142, which is formed using the e-beam evaporation process, is inclined at an angle α of about 5° to about 45°.

FIG. 7 illustrates a state in which a metal is not formed on the photoresist pattern 160 during the formation of the reflective metal layer 142 and the stress relaxation layer 143.

Next, a conductive barrier layer 144 is formed through the opened region of the photoresist pattern 160.

The conductive barrier layer 144 includes W, TiW, Mo, Cr, Ni, Pt, Rh, Pd, or Ti. A material of the conductive barrier layer 144 may vary depending on materials of the reflective metal layer 142 or the stress relaxation layer 143.

The conductive barrier layer 144 is formed on the stress relaxation layer 143 and shields side surfaces of the reflective metal layer 142 or the stress relaxation layer 143. Accordingly, a metal of the reflective metal layer 142 is prevented from diffusing into the second semiconductor layer 130 through lateral diffusion. The formation of the conductive barrier layer 144 is performed using a metal deposition process. In one implementation, the conductive barrier layer 144 is formed using an isotropic etching process. This is because the conductive barrier layer 144 is configured to surround the side surfaces of the stress relaxation layer 143 and the reflective metal layer 142. For example, the conductive barrier layer 144 may be formed using a sputtering process.

In one implementation, the conductive barrier layer 144 may be a single layer with a thickness of about 100 nm or more and including a specific metal. In another implementation, the conductive barrier layer 144 may include at least two metal materials that are alternately stacked, each metal material forming a layer of the conductive barrier layer 144 to have a thickness of about 20 nm or more. For example, the conductive barrier layer 144 may be formed by alternately depositing a TiW layer having a thickness of about 50 nm and a Ni layer or Ti layer having a thickness of about 50 nm.

The conductive barrier layer 144 has a different thickness according to various conditions of the underlying layer including a state or gradient of an underlying layer. The conductive barrier layer 144 is formed to extend to an upper portion of the second semiconductor layer 130. Since a gradient α of a side surface of the underlying layer has an angle of about 45° or less, occurrence of cracks that is caused by the sharp gradient is prevented in the conductive barrier layer 144.

In some implementations, a Ni/Au/Ti layer may be additionally formed on the conductive barrier layer 144 to enable stable contact of the conductive barrier layer 144 with a material during a subsequent process.

As described above, a material of the stress relaxation layer 143 may be selected according to the materials of the reflective metal layer 142 and the conductive barrier layer 144. This is because a coefficient of thermal expansion of the stress relaxation layer 143 is higher than that of the conductive banner layer 144 and lower than that of the reflective metal layer 142. Accordingly, when the reflective metal layer 142 includes Al or an Al alloy, and the conductive barrier layer 144 includes W, TiW, or Mo, the stress relaxation layer 143 may be a single layer formed of or including Ag, Cu, Ni, Pt, Ti, Rh, Pd, or Cr, or a combination formed of or including Cu, Ni, Pt, Ti, Rh, Pd or Au. Also, when the reflective metal layer 142 includes Al or an Al alloy, and the conductive barrier layer 144 includes Ti, Cr, Pt, Rh, Pd, or Ni, the stress relaxation layer 143 may be a single layer formed of or including Ag or Cu, or a combination formed of or including Ni, Au, Cu, or Ag. Furthermore, when the reflective metal layer 142 includes Ag or a Ag alloy, and the conductive barrier layer 144 includes W, TiW, or Mo, the stress relaxation layer 143 may be a single layer formed of or including Cu, Ni, Pt, Ti, Rh, Pd, or Cr, or a combination formed of or including Cu, Ni, Pt, Ti, Rh, Pd, Cr, or Au. Also, when the reflective metal layer 142 includes Ag or a Ag alloy, and the conductive barrier layer 144 includes Pt or Ni, the stress relaxation layer 143 may be a single layer formed of or including Cu, Cr, Rh, Pd, TiW, or Ti, or a combination formed of or including Ni, Au, or Cu.

Referring to FIG. 8, the photoresist pattern 160 is removed. Accordingly, the second semiconductor layer 130 and the reflection pattern 140 are exposed. For example, edge portions of the second semiconductor layer 130 and the reflection pattern 140 disposed between the edge portions of the second semiconductor layer 130 are exposed. Also, the mesa region 150 is exposed by removing the photoresist pattern 160. This is the same as described with reference to FIG. 3.

Due to the above-described processes, the reflection pattern 140 is formed on the second semiconductor layer 130. The reflection pattern 140 includes a reflective metal layer 142, a stress relaxation layer 143, and a conductive barrier layer 144. The stress relaxation layer 143 has a lower coefficient of thermal expansion than the reflective metal layer 142 and a higher coefficient of thermal expansion than the conductive barrier layer 144. Accordingly, stress caused due to a difference in coefficient of thermal expansion between the reflective metal layer 142 and the conductive barrier layer 144 is absorbed in the stress relaxation layer 143. As discussed above, the stress relaxation layer 143 can be omitted in some implementations.

In addition, the conductive barrier layer 144, which is formed on the reflective metal layer 142 or the stress relaxation layer 143, has a different thickness according to various properties of the underlying layer including the shape and type of the underlying layer. For example, a thickness t1 of the conductive barrier layer 144 formed on the surface of the reflective metal layer 142 or the stress relaxation layer 143 is greater than a thickness t3 of the conductive barrier layer 144 formed on the surface of the second semiconductor layer 130. Also, the thickness 13 formed on the second semiconductor layer 130 is greater than a thickness t2 of the conductive barrier layer 144 formed on side surfaces of the reflective metal layer 142 or the stress relaxation layer 143.

The above difference in thickness is obtained by performing an isotropic deposition process after forming a photoresist pattern having an overhang structure. That is, deposition is performed to the highest extent on a top surface of the reflective metal layer 142 or stress relaxation layer 144, which is exposed by the photoresist pattern, and deposition may be performed to a relatively high extent on a surface of the second semiconductor layer 130 because the second semiconductor layer 130 has a planar structure. In contrast, since a side surface of the reflective metal layer 142 or the stress relaxation layer 143 has a predetermined inclination and a metal to be deposited should be adhered to sidewalls of the reflective metal layer 142 or the stress relaxation layer 143, the deposition is performed to a relatively low extent on the side surface of the reflective metal layer 142 or the stress relaxation layer 143.

Furthermore, the side surface of the reflective metal layer 142 or the stress relaxation layer 143 is inclined at an angle α of about 5° to about 45°. A required inclination angle may be formed by controlling an angle of a substrate during an e-beam evaporation process. For example, by orienting the substrate at a predetermined angle with respect to an imaginary direction in which metal ions or particles are predicted to proceed, the inclination angle α of the side surface of the reflective metal layer 142 or the stress relaxation layer 143 may be controlled. By setting the inclination angle α of the side surface, occurrence of cracks can be prevented in a conductive barrier layer 144 during a subsequent process.

FIGS. 9 through 18 are plan views and cross-sectional views illustrating an exemplary method of manufacturing an LED module according to another implementation of the disclosed technology.

FIG. 9 shows a plan view illustrating an exemplary method of manufacturing an LED module and FIG. 10 shows a cross-sectional view taken along the line A-A' of FIG. 9.

As explained above, a first semiconductor layer 110, an active layer 120, and a second semiconductor layer 130 are sequentially stacked on a substrate 100, and a mesa region 150 is formed using an etching process. A portion of a surface of the first semiconductor layer 110 is exposed through the mesa region 150. Also, a reflection pattern 140 is formed on the second semiconductor layer 130.

In the drawings of the present implementation, the reflection pattern 140 is exaggerated for brevity. In one implementation, the reflection pattern 140 may be formed in the same manner as described with regard to FIGS. 4 through 8. In another implementation, the reflection pattern 140 may be formed using other different techniques.

In some implementations, the substrate 100 may be a substrate on which surface treatment is not performed, or a patterned substrate. Also, a surface of the substrate 100 may have a moth-eye structure. For example, pointed structures 100a may be densely disposed on the surface of the substrate 100. Alternatively, the substrate 100 may have a protrusion protruding in a roughly hemispherical shape, and pointed structures may be densely disposed on the protrusion.

Referring to FIGS. 11 and 12, a first insulating layer 200 is formed on the resultant structure of FIG. 9. The first insulating layer 200 may be formed of or include a transparent nonconductor. In one implementation, silicon oxide may be used as the first insulating layer 200. The first insulating layer 200 is patterned using a photoresist process. By patterning the first insulating layer 200, the first semiconductor layer 110 formed in the mesa region 150 is exposed, and selective portions of the reflection pattern 140 are exposed. A first pad region 205 is defined to include the exposed selective portions of the reflection pattern 140 and the patterned first insulating layer 200 formed on the reflection pattern 140.

FIG. 11 shows a plan view illustrating an exemplary method of manufacturing an LED module and FIG. 12 shows cross-sectional views taken along the line A1-A1' and the line B1-B1' of FIG. 11.

Referring to the cross-sectional view taken along the direction A1-A1', the first insulating layer 200 has a patterned shape on the reflection pattern 140 to expose selective portions of the reflection pattern 140. Also, the first insulating layer 200 is not formed in in the mesa region 150 to expose the first semiconductor layer 110. In one implementation, the reflection pattern 140 exposed by the first insulating layer 200 in the first pad region 205 may be provided in the form of a hole 200a as shown in FIG. 12. However, other implementations are also possible such that the reflection pattern 140 exposed by the first insulating layer 200 in the first pad region 205 may be or include a stripe form.

Referring to the cross-sectional view taken along the direction B1-B1', the first insulating layer 200 completely shields or covers the reflection pattern 140. The first semiconductor layer 110 is exposed in the mesa region 150.

Referring to FIGS. 13 and 14, a conductive reflection layer 210 is formed.

Referring to FIG. 13, the conductive reflection layer 210 is coated on the entire surface of the resultant structure of FIG. 11 except an opening 210a. The first pad region 205 is exposed within the opening 210a. Also, the conductive reflection layer 210 is formed in the mesa region 150 and electrically connected to the first semiconductor layer 110.

FIG. 13 shows a plan view illustrating an exemplary method of manufacturing an LED module and FIG. 14 shows cross-sectional views taken along the line A2-A2' and the line B2-B2' of FIG. 13.

Referring to the cross-sectional view taken along the line A2-A2', the conductive reflection layer 210 is formed on the first insulating layer 200 and the exposed first semiconductor layer 110.

Accordingly, the conductive reflection layer 210 is coated on the entire surface except the first pad region 205. Also, the conductive reflection layer 210 is formed on the first semiconductor layer 110 exposed in the mesa region 150 and electrically connected to the first semiconductor layer 110.

The conductive reflection layer 210 is formed of or includes a conductive material. The conductive reflection layer 210 may include Al. Accordingly, the first semiconductor layer 110 and the conductive reflection layer 210 are electrically connected, and the reflection pattern 140 is electrically insulated from the conductive reflection layer 210 by the first insulating layer 200.

In addition, a reflection barrier layer (not shown) may be formed on the conductive reflection layer 210. The reflection barrier layer prevents diffusion of a metal of the conductive reflection layer 210. In one implementation, the reflection barrier layer may be a single layer formed of or including Ni, Cr, or Au, or a combination thereof. In another implementation, the reflection barrier layer is a combined layer formed of or including Ti/Al/Ti/Ni/Au. Also, an adhesive layer (not shown) may be further provided under the conductive reflection layer 210. The adhesive layer may include Ti, Cr, or Ni.

The conductive reflection layer 210 may be formed by stacking the conductive reflection layer 210 and patterning the conductive reflection layer 250 using an etching process. Alternatively, the conductive reflection layer 210 may be formed using a lift-off process. That is, photoresist is coated on the first pad region 205 in which selective portions of the reflection pattern 140 are exposed, and the conductive reflection layer 210 is formed using a deposition process.

Then, by removing the photoresist from the first pad region 205, the conductive reflection layer 210 is formed to expose the first pad region 205.

Referring to FIGS. 15 and 16, a second insulating layer 220 is formed on the resultant structure of FIG. 13.

Referring to a plan view of FIG. 15, the second insulating layer 220 includes first holes 220a and second holes 220b. The first holes 220a are formed in the first pad region 205, and a second pad region 225 is defined by the second holes 220b to be under the first pad region 225. Selective portions of the conductive reflection layer 210 are exposed by the second holes 220b formed in the second pad region 225. When a reflection barrier layer is formed on the conductive reflection layer 210, selective portions of the reflection barrier layer may be exposed by the second holes 220b formed in the second pad region 225.

In FIG. 15, the number of first holes 220a may be equal to or greater than the number of second holes 220b. This facilitates diffusion of current through the reflection pattern 140 exposed by the first holes 220a. When the second semiconductor layer 130 is or includes a p-type semiconductor layer, current division into the p-type semiconductor layer becomes a problem in applying current. Accordingly, by controlling the number of first holes 220a to be equal to or greater than the number of second holes 220b, current can be smoothly divided into the second semiconductor layer 130.

This will be clearly described with reference to a cross-sectional view of FIG. 16.

FIG. 15 shows a plan view illustrating an exemplary method of manufacturing an LED module and FIG. 16 shows cross-sectional views taken along lines A3-A3', B3-B3', and C-C' of FIG. 15.

The line A3-A3' crosses the first pad region 205, and the second insulating layer 220 is formed on the conductive reflection layer 210 in the cross-sectional view taken along the line A3-A3'. When a reflection barrier layer is formed on the conductive reflection layer 210, the second insulating layer 220 is formed on the reflection barrier layer. The second insulating layer 220 has the first holes 220a in the first pad region 205, and is also formed on the mesa region 150. In some implementations, the second insulating layer 220 may be formed on the first insulating layer 200 formed on the first pad region 205. In other implementations, the second insulating layer 220 may be not formed on the first insulating layer 200 disposed in the first pad region 205.

Also, the line B3-B3' crosses the second pad region 225, and the second insulating layer 220 is formed on the conductive reflection layer 210 disposed on the mesa region 150 in the cross-sectional view taken along the line B3-B3'. In addition, the second insulating layer 220 is formed to expose selective portions of the conductive reflection layer 210 formed on the reflection pattern 140 except the mesa region 150. That is, the second insulating layer 220 is provided in a patterned shape on the conductive reflection layer 210 disposed on the reflection pattern 140. Accordingly, the selective portions of the conductive reflection layer 210 are exposed to define the second pad region 225. The second pad region 225 includes the exposed selected portion of the conductive reflection layer 210 and the patterned second insulating layer 220 formed on the conductive reflection layer 210. In some implementations, the portion of the conductive reflection layer 210 may be also exposed on the mesa region 150. Furthermore, the second insulating layer 220 in the second pad region 225 may expose the conductive reflection layer 210 such that the exposed conductive reflection layer 210 forms in the shape of the second holes 220b or in a stripe form.

The line C-C' crosses the first pad region 205 and the second pad region 225, and the second insulating layer 220 is formed on the conductive reflection layer 210 in the cross-sectional view taken along the line C-C'. The second insulating layer 220 exposes selective portions of the underlying reflection pattern 140 in the first pad region 205, and shields or covers the conductive reflection layer 210 between the first and second pad regions 205 and 225. Also, the second insulating layer 220 is provided in a patterned shape in the second pad region 225 to expose the underlying conductive reflection layer 210.

The second insulating layer 220 may be formed of or include any insulating material. In some implementations, an oxide-based insulating material, a nitride-based insulating material, a polymer (e.g., polyimide, Teflon, or parylene) may be used for the second insulating layer 220.

Referring to FIGS. 17 and 18, a first pad 230 and a second pad 240 are formed on the resultant structure of FIG. 15. The first pad 230 is electrically connected to the exposed reflection pattern 140 of the first pad region 205 in FIGS. 15 and 16. Accordingly, the first pad 230 and the second semiconductor layer 130 are electrically connected. The second semiconductor layer 130 is electrically connected to an external power source or power supply line through the first pad 230.

The second pad 240 is electrically connected to the exposed conductive reflection layer 140 of the second pad region 225 in FIGS. 15 and 16. Accordingly, the second pad 240 and the first semiconductor layer 110 are electrically connected. The first semiconductor layer 110 is electrically connected to an external power source or power supply line through the second pad 240.

In some implementations, an area of the first pad 230 electrically connected to the second semiconductor layer 130 is controlled to be greater than an area of the second pad 240 electrically connected to the first semiconductor layer 110. If the second semiconductor layer 130 is a p-type semiconductor layer, heat emission through the p-type semiconductor layer may be a problem. By increasing a contact area between the second pad 240 and a printed circuit board (PCR) to be greater than the area of the first pad 230, the problem regarding heat emission can be solved.

The first pad 230 and the second pad 240 may have a double layered structure including a layer including Ti, Cr, or Ni and a layer including Al, Cu, Ag, or Au. Also, the first pad 230 and the second pad 210 may be formed by patterning photoresist, depositing a metal material between patterned spaces, and removing the deposited metal material using a lift-off process. Also, a double or single metal layer is formed, and then a pattern is formed using a photolithography process, and the first and second pads 230 and 240 may be formed by a dry etching process or wet etching process using the pattern. Here, an etchant used during the dry or wet etching process may be determined depending on characteristics of an etched metal material.

In addition, a pad barrier layer (not shown) formed of or including a conductive material may be formed on the first pad 230 or the second pad 240. The pad barrier layer is provided to prevent diffusion of a metal during a subsequent process including bonding or soldering the pads 230 and 240. For example, during the bonding or soldering process, tin (Sn) atoms contained in a bonding metal or soldering material are prevented from diffusing into the pads 230 and 240, thereby increasing the resistivity of the pads 230 and 240. In some implementations, the pad barrier layer may include Or, Ni, Ti W, TiW, Mo, Pt, or a combination thereof.

FIG. 17 shows a plan view illustrating an exemplary method of manufacturing an LED module and FIG. 18 shows cross-sectional views taken along a line A4-A4', a line B4-B4', and a line C1-C1' of the plan view of FIG. 17.

The line A4-A4' crosses the first pad 230. As shown in the cross-sectional view taken along the line A4-A4', the first pad 230 shields or covers a first pad region and is electrically connected to the reflection pattern 140. Accordingly, the second semiconductor layer 130 and the first pad 230 are electrically connected. Also, the first pad 230 may be formed in a mesa region 150.

the line B4-B4' crosses the second pad 240. As shown in the cross-sectional view-taken along the line B4-B4', the second pad 240 is formed on a second pad region. Since selective portions of a conductive reflection layer 210 is exposed through a patterned second insulating layer 220 in the second pad region, the second pad 240 filling or covering the second pad region is electrically connected to the conductive reflection layer 210. Since the conductive reflection layer 210 is electrically connected to the first semiconductor layer 110 in the mesa region 150, the first semiconductor layer 110 is electrically connected to the second pad 240.

The line C1-C1' crosses the first pad 230 and the second pad 240, and the first semiconductor layer 110, an active layer 120, and the second semiconductor layer 130 formed on a substrate 100 using a mesa etching process have a predetermined inclination angle with respect to the surface of the substrate 100. Also, a first insulating layer 200, the conductive reflection layer 210, and the second insulating layer 220 are sequentially stacked on sidewalls of the first semiconductor layer 110, the active layer 120, and the second semiconductor layer 130.

In the first pad region, the first insulating layer 200 or the second insulating layer 220 is formed in a patterned shape, and selective portions of me reflection pattern 140 are opened or exposed. Also, the first pad 230 is formed on the first pad region. The first pad 230 is isolated from the second pad 240, which is another pad, by the second insulating layer 220. Accordingly, the first pad 230 is electrically connected to the second semiconductor layer 130 through the reflection pattern 140.

Also, the second insulating layer 220 is formed in a patterned shape in the second pad region, and the conductive reflection layer 210 is opened or exposed in a region opened or exposed by the second pad 240. Accordingly, the second pad 240 is connected to the conductive reflection layer 210. The conductive reflection layer 210 is connected to the first semiconductor layer 110 in the mesa region 150. Accordingly, the second pad 240 is electrically connected to the first semiconductor layer 110.

In addition, an area of the reflection pattern 140 opened by the first insulating layer 200 or the second insulating layer 220 that are patterned in the first pad region exceeds an area of the conductive reflection layer 210 opened or exposed by the second insulating layer 220 patterned in the second pad region. This is because the reflection pattern 140 electrically connected to the first pad 230 is connected to the second semiconductor layer 130, and the conductive reflection layer 210 electrically connected to the second pad 240 is connected to the first semiconductor layer 110. In some implementations, the second semiconductor layer 130 has a p conductivity type and the first semiconductor layer 110 has an n conductivity type. The mobility of holes in a p-type semiconductor layer is lower than the mobility of electrons in an n-type semiconductor layer. Accordingly, a channel in which current is supplied through an electrode may be wider in a p type than in an n type.

In addition, the first insulating layer 200 or the second insulating layer 220 that is patterned on the reflection pattern 140 connected to the second semiconductor layer 130 prevents local current crowding. This prevents direct supply of current through a pad in high voltage or high-power conditions. With the patterned structures of the first insulating layer 200 or the second insulating layer 220, the first insulating layer 200 or the second insulating layer 220 screens some of current supplied from the first pad 230 disposed on the first or second insulating layer 200 or 220, and divides the screened current into a space between the first and second insulating layers. Thus, uniform current is supplied to the second semiconductor layer 130.

Furthermore, the first insulating layer 200 formed on side surfaces of the active layer 120, the second semiconductor layer 130, and the reflection pattern 140 functions as a reflection plate of light generated in the active layer 120. For instance, when a wavelength of light generated in the active layer is $\lambda$, a thickness of the first insulating layer 200 may be an integer multiple of $\lambda/4$. In this case, reflection of light may be performed on the surface of the first insulating layer 200, and constructive interference may occur.

For example, when the wavelength of light generated in the active layer 120 has a center wavelength of about 450 nm, the first insulating layer 200 may be formed to a thickness of about 8000 Å to about 9000 Å. Also, the thickness of the second insulating layer 220 may be smaller than the thickness of the first insulating layer 200.

In addition, when a flip-chip-type LED module is applied to a PCB, a side surface of the substrate 100 may have an uneven structure using a sawing or laser cutting process. Light generated in the active layer 120 is easily emitted to the outside through the substrate 100 having the side surface with the uneven structure.

In an LED module formed through the above-described processes, pads are formed on the patterned pad regions. Thus, local current crowding may be prevented. Also, diffusion of a metal is prevented by the reflection barrier layer provided between the conductive reflection layer 210 and the pads. For instance, a metal of the conductive reflection layer 210 is prevented from moving to the second pad 240 and increasing the resistivity of the second pad 240. Also, the second semiconductor layer 130 is electrically connected to the first pad 230. A pad barrier layer is formed on each of the pads. The pad barrier layer prevents diffusion of the metal generated during a bonding or soldering process so that the first pad 230 or the second pad 240 can have a high conductivity and be in electrical contact with the outside.

FIG. 19 is a cross-sectional view of an exemplary LED package according to another implementation of the disclosed technology.

Referring to FIG. 19, after a final resultant structure described with reference to FIGS. 17 and 18 is separated into respective unit modules, a phosphor layer 300 is formed on side and rear surfaces of each of the unit modules. The phosphor layer 300 may be formed by processes including re-arranging a plurality of separated unit modules such that the substrate 100 faces upward, and coaling a phosphor slurry on the substrate 100. In this case, the phosphor slurry may also be coated on side surfaces of the modules. Subsequently, the phosphor slurry is cured and separated into respective modules again.

Meanwhile, a package substrate 400 is provided. A first bonding pad 430 and a second bonding pad 440 may be disposed on the package substrate 400 and spaced apart from one another. A solder resist layer 420 having an opening exposing partial upper regions of the bonding pads 430 and 440 may be disposed on the bonding pads 430 and 440.

The module having the phosphor layer 300 is disposed on the package substrate 400. Thereafter, a first pad 230 and a second pad 240 of the module are electrically connected to the first bonding pad 430 and the second bonding pad 440 using conductive adhesives 430 and 450.

Furthermore, in the present implementation, the phosphor layer 300 absorbs light generated in the active layer 120 and generates light having a different wavelength. The phosphor layer 300 may be a single layer or have a multi-layered structure. For example, the phosphor layer 300 which has characteristics for wavelength conversion may have a stacked structure of a first phosphor layer (not shown) and a second phosphor layer (not shown). For instance, the first phosphor layer may have an regular uneven configurations defining grooves, and the second phosphor layer may be formed to fill grooves of the first phosphor layer.

In addition, when the phosphor layer 300 has characteristics for wavelength conversion into a plurality of wavelengths, the first phosphor layer may be formed of or include a different material from the second phosphor layer. Alternatively, the first and second phosphor layers may be formed of or include the same kind of phosphor with different concentrations.

The phosphor layer 300 may be coated or formed of a molding resin using a dispenser. Alternatively, the phosphor layer 300 may be formed using a spraying process, a molding process, a printing process, or a filling process in vacuum.

FIGS. 20 through 29 are plan views and cross-sectional views illustrating a method of manufacturing an LED module according to another implementations of the disclosed technology.

Referring to FIGS. 20 and 21, FIG. 20 shows a plan view illustrating an exemplary method of manufacturing an LED module and FIG. 21 shows a cross-sectional view taken along a direction A-A' of FIG. 20.

A first semiconductor layer 110, an active layer 120, and a second semiconductor layer 130 are sequentially stacked on a substrate 100, and a mesa region 150 is formed using an etching process. A portion of a surface of the first semiconductor layer 110 is exposed through the mesa region 150. Also, a reflection pattern 140 is formed on the second semiconductor layer 130.

In the drawings of the present implement 100, the reflection pattern 140 is exaggerated for brevity. In one implementation, the reflection pattern 140 may be formed in the same manner as described with regard to FIGS. 4 through 8. In another implementation, the reflection pattern 140 may be formed using other different techniques.

In some implementations, the substrate 100 may be a substrate on which surface treatment is not performed, or a patterned substrate. Also, a surface of the substrate 100 may have a moth-eye structure. For example, pointed structures 100a may be densely disposed on the surface of the substrate 100. Alternatively, the substrate 100 may have a protrusion protruding in a roughly hemispherical shape, and pointed structures may be densely disposed on the protrusion.

Referring to FIGS. 22 and 23, a first insulating layer 200 is formed on the resultant structure of FIG. 20. The first insulating layer 200 may be formed of or include a transparent nonconductor. In one implementation, silicon oxide may be used as the first insulating layer 200. The first insulating layer 200 is patterned using a photoresist process. By patterning the first insulating layer 200, the first semiconductor layer 110 formed in the mesa region 150 is exposed, and selective portions of the reflection pattern 140 are exposed. A first pad region 205 is defined to include the exposed selective portions of the reflection pattern 140 and the patterned first insulating layer 200 formed on the reflection pattern 140.

FIG. 22 shows a plan view illustrating an exemplary method of manufacturing an LED module and FIG. 23 shows cross-sectional views taken along the direction A1-A1' and the direction B1-B1' of FIG. 22.

Referring to the cross-sectional view taken along the direction A1-A1', the first insulating layer 200 is provided in a patterned shape on the reflection pattern 140 to expose selective portions of the reflection pattern 140. Also, the first insulating layer 200 is not formed in the mesa region 150 to expose the first semiconductor layer 110. In one implementation, the reflection pattern 140 exposed by the first insulating layer 200 in the first pad region 205 may be provided in the form of a hole 200a as shown in FIG. 23. However, other implementations are also possible such that the reflection pattern 140 exposed by the first insulating layer 200 in the first pad region 205 may be or include a stripe form.

Referring to the cross-sectional view taken along the direction B1-B1', the first insulating layer 200 completely shields or covers the reflection pattern 140. The first semiconductor layer 110 is exposed in the mesa region 150.

Referring to FIGS. 24 and 25, a conductive reflection layer 210 is formed.

Referring to FIG. 24, the conductive reflection layer 210 is coated on the entire surface of the resultant structure of FIG. 22 except an opening 210a. The first pad region 205 is exposed within the opening 210a. Also, the conductive reflection layer 210 is formed in the mesa region 150 and electrically connected to the first semiconductor layer 110.

FIG. 24 shows a plan view illustrating an exemplary method of manufacturing an LED module and FIG. 25 shows cross-sectional views taken along a line A2-A2' and a line B2-B2' of FIG. 24.

Referring to the cross-sectional view taken along the line A2-A2', the conductive reflection layer 210 is formed on the first insulating layer 200 and the exposed first semiconductor layer 110.

Accordingly, the conductive reflection layer 210 is coated on the entire surface except the first pad region 205, and formed on the first semiconductor layer 110 exposed in the mesa region 150 and electrically connected to the first semiconductor layer 110.

The conductive reflection layer 210 is formed of or includes a conductive material. The conductive reflection layer 210 may include Al. Accordingly, the first semiconductor layer 110 and the conductive reflection layer 210 are electrically connected, and the reflection pattern 140 is electrically insulated from the conductive reflection layer 210 by the first insulating layer 200.

In addition, a reflection barrier layer (not shown) may be formed on the conductive reflection layer 210. The reflection barrier layer prevents diffusion of a metal of the conductive reflection layer 210. In one implementation, the reflection barrier layer may be a single layer formed of or including Ni, Cr, or Au, or a combination thereof, in another implementation, the reflection barrier layer is a combined layer formed of or including Ti/AlTi/Ni/Au. Also, an adhesive layer (not shown) may be further provided under the conductive reflection layer 210. The adhesive layer may include Ti, Cr, or Ni.

The conductive reflection layer 210 may be performed by stacking the conductive reflection layer 210 and patterning the conductive reflection layer 210 using an etching process.

Alternatively, the conductive reflection layer 210 may be formed using a lift-off process. That is, photoresist is coated on the first pad region 205 in which selective portions of the reflection pattern 140 are exposed, and the conductive reflection layer 210 is formed using a deposition process. Then, by removing the photoresist from the first pad region 205, the conductive reflection layer 210 is formed to expose the first pad region 205.

Referring to FIGS. 26 and 27, a second insulating layer 220 is formed on the resultant structure of FIG. 24.

Referring to a plan view of FIG. 26, the second insulating layer 220 includes first holes 220a and second holes 220b. The first holes 220a are formed in the first pad region 205, and an underlying second pad region 225 is defined by the second holes 220b. Selective portions of the conductive reflection layer 210 are exposed by the second holes 220b formed in the second pad region 225. When a reflection barrier layer is formed on the conductive reflection layer 210, selective portions of the reflection barrier layer may be exposed by the second holes 220b formed in the second pad region 225.

In FIG. 26, the number of first holes 220a may be equal to or greater than the number of second holes 220b. This facilitates diffusion of current through the reflection pattern 140 exposed by the first holes 220a. When the second semiconductor layer 130 is or includes a p-type semiconductor layer, current division into the p-type semiconductor layer becomes a problem in applying current. Accordingly, by controlling the number of first holes 220a to be equal to or greater than the number of second holes 220b, current may be smoothly divided into the second semiconductor layer 150.

This will be clearly described with reference to a cross-sectional view of FIG. 27.

FIG. 26 shows a plan view illustrating an exemplary method of manufacturing an LED module and FIG. 27 illustrates cross-sectional views taken along lines A3-A3', B3-B3', and C-C' of FIG. 26.

The line A3-A3' crosses the first pad region 205, and the second insulating layer 220 is formed on the conductive reflection layer 210 in the cross-sectional view taken along the line A3-A3'. When a reflection barrier layer is formed on the conductive reflection layer 210, the second insulating layer 220 is formed on the reflection barrier layer. The second insulating layer 220 has the first holes 220a in the first pad region 205, and is also formed on the mesa region 150. In some implementations, the second insulating layer 220 may be formed on the first insulating layer 200 formed on the first pad region 205. In other implementations, the second insulating layer 220 may be not formed on the first insulating layer 200 disposed on the first pad region 205.

Also, the line B3-B3' crosses the second pad region 225, and the second insulating layer 220 is formed on the conductive reflection layer 210 disposed on the mesa region 150 in the cross-sectional view taken along the line B3-B3'. In addition, the second insulating layer 220 is formed to expose selective portions of the conductive reflection layer 210 formed on the reflection pattern 140 except the mesa region 150. That is, the second insulating layer 220 is provided in a patterned shape on the conductive reflection layer 210 disposed on the reflection pattern 140. Accordingly, the selective portions of the conductive reflection layer 210 are exposed to define the second pad region 225. The second pad region 225 includes the exposed selected portion of the conductive reflection layer 210 and the patterned second insulating layer 220 formed on the conductive reflection layer 210. In some implementations, the portion of the conductive reflection layer 210 may be also exposed on the mesa region 150. Furthermore, the second insulating layer 220 in the second pad region 225 may expose the conductive reflection layer 210 such that the exposed conductive reflection layer 210 forms in the shape of the second holes 220b or in a stripe form.

The line C-C' crosses the first pad region 205 and the second pad region 225, and the second insulating layer 220 is formed on the conductive reflection layer 210 in the cross-sectional view taken along the line C-C'. The second insulating layer 220 exposes selective portions of the underlying reflection pattern MO in the first pad region 205, and shields or covers the conductive reflection layer 210 between the first and second pad regions 205 and 225. Also, the second insulating layer 220 is provided in a patterned shape in the second pad region 225 to expose the underlying conductive reflection layer 210.

The second insulating layer 220 may be formed of or include any insulating material. In some implementations, an oxide-based insulating material, a nitride-based insulating material, a polymer (e.g., polyimide, Teflon, or parylene) may be used to form the second insulating layer 220.

Referring to FIGS. 28 and 29, a first pad 230 and a second pad 240 are formed on the resultant structure of FIG. 26. The first pad 230 is electrically connected to the exposed reflection pattern 140 of the first pad region 205 in FIGS. 26 and 27. Accordingly, the first pad 230 and the second semiconductor layer 130 are electrically connected. This indicates that the second semiconductor layer 130 is electrically connected to an external power source or power supply line through the first pad 230.

Also, the second pad 240 is electrically connected to the exposed conductive reflection layer 140 of the second pad region 225 in FIGS. 26 and 27. Accordingly, the second pad 240 and the first semiconductor layer 110 are electrically connected. This indicates that the first semiconductor layer 110 is electrically connected to an external power source or power supply line through the second pad 240.

In some implementations, an area of the first pad 230 electrically connected to the second semiconductor layer 130 is controlled to be greater than an area of the second pad 240 electrically connected to the first semiconductor layer 110. If the second semiconductor layer 130 is a p-type semiconductor layer, heat emission through the p-type semiconductor layer may be a problem. By increasing a contact area between the second pad 240 and a printed circuit board (PCB) to become greater than the area of the first pad 230, the problem regarding heat emission may be solved.

The first pad 230 and the second pad 240 may have a double layered structure including a layer including Ti, Cr, or Nt and a layer including Al, Cu, Ag, or Au. Also, the first pad 230 and the second pad 240 may be formed by patterning photoresist, depositing a metal material between patterned spaces, and removing the deposited metal material using a lift-off process. Also, a double or single metal layer is formed, and then a pattern is formed using a photolithography process and the first and second pads 230 and 240 may be formed by a dry etching process or wet etching process using the pattern. Here, an etchant used during the dry or wet etching process may be determined depending on characteristics of an etched metal material.

In addition, a pad barrier layer (not shown) formed of or including a conductive material may be formed on the first pad 230 or the second pad 240. The pad barrier layer is provided to prevent diffusion of a metal during a subsequent process including bonding or soldering the pads 230 and 240. For example, during the bonding or soldering process, tin (Sn) atoms contained in a bonding metal or soldering material are prevented from diffusing into the pads 230 and 240, thereby increasing the resistivity of the pads 230 and 240. In some implementations, the pad barrier layer may include Cr, Ni, Ti W, TiW, Mo, Pt, or a combination thereof.

FIG. 28 shows a plan view illustrating an exemplary method of manufacturing an LED module and FIG. 29 illustrates cross-sectional views taken along a line A4-A4', a line B4-B4', and a line C1-C1' of FIG. 28.

The line A4-A4' crosses the first pad 230, and as shown in the cross-sectional view taken along the line A4-A4' the first pad 230 shields or covers a first pad region and is electrically connected to the reflection pattern 140. Accordingly, the second semiconductor layer 130 and the first pad 230 are electrically connected. Also, the first pad 230 may be formed in a mesa region 150.

The line B4-B4' crosses the second pad 240, and as shown in the cross-sectional view taken along the line B4-B4', the second pad 240 is formed on a second pad region. Since selective portions of a conductive reflection layer 210 is exposed through a patterned second insulating layer 220 in the second pad region, the second pad 240 filling or covering the second pad region is electrically connected to the conductive reflection layer 210. Since the conductive reflection layer 210 is electrically connected to the first semiconductor layer 110 in the mesa region 150, the first semiconductor layer 110 is electrically connected to the second pad 240.

The line C1-C1' crosses the first pad 230 and the second pad 240, and the first semiconductor layer 110, an active layer 120, and the second semiconductor layer 130 formed on a substrate 110 using a mesa etching process have a predetermined inclination angle with respect to the surface of the substrate 100. Also, a first insulating layer 200, the conductive reflection layer 210, and the second insulating layer 220 are sequentially stacked on sidewalls of the first semiconductor layer 110, the active layer 120, and the second semiconductor layer 130.

In the first pad region, the first insulating layer 200 or the second insulating layer 220 is formed in a patterned shape, and selective portions of the reflection pattern 140 are opened or exposed. Also, the first pad 230 is formed on the first pad region. The first pad 230 is isolated from the second pad 240, which is another pad, by the second insulating layer 220. Accordingly, the first pad 230 is electrically connected to the second semiconductor layer 130 through the reflection pattern 140.

Also, the second insulating layer 220 is formed in a patterned shape in the second pad region, and the conductive reflection layer 210 is opened or exposed in a region opened or exposed by the second pad 240. Accordingly, the second pad 240 is connected to the conductive reflection layer 210. The conductive reflection layer 210 is connected to the first semiconductor layer 110 in the mesa region 150. Accordingly, the second pad 240 is electrically connected to the first semiconductor layer 110.

In addition, an area of the reflection pattern 140 opened by the first insulating layer 200 or the second insulating layer 220 that are patterned in the first pad region exceeds an area of the conductive reflection layer 210 opened or exposed by the second insulating layer 220 patterned in the second pad region. This is because the reflection pattern 140 electrically connected to the first pad 230 is connected to the second semiconductor layer 130, and the conductive reflection layer 210 electrically connected to the second pad 240 is connected to the first semiconductor layer 110. In some implementations, the second semiconductor layer 130 has a p conductivity type and the first semiconductor layer 110 has an a conductivity type. The mobility of holes in a p-type semiconductor layer is lower than the mobility of electrons in an n-type semiconductor layer. Accordingly, a channel in which current is supplied through an electrode may be wider in a p type than in an n type.

In addition, the first insulating layer 200 or the second insulating layer 220 that is patterned on the reflection pattern 140 connected to the second semiconductor layer 130 prevents local current crowding. This prevents direct supply of current through a pad in high-voltage or high-power conditions. With the patterned structures of the first insulating layer 200 or the second insulating layer 220 patterned, the first insulating layer 200 or the second insulating layer 220 screens some of current supplied from the first pad 230 disposed on the first or second insulating layer 200 or 220, and divides the screened current into a space between the first and second insulating layers. Thus, uniform current is supplied to the second semiconductor layer 130.

Furthermore, the first insulating layer 200 formed on side surfaces of the active layer 120, the second semiconductor layer 130, and the reflection pattern 140 functions as a reflection plate of light generated in the active layer 120. For instance, when a wavelength of light generated in the active layer is λ, a thickness of the first insulating layer 200 may be an integer multiple of λ/4. In this ease, reflection of light may be performed on the surface of the first insulating layer 200, and constructive interference may occur.

For example, when the wavelength of light generated in the active layer 120 has a center wavelength of about 450 nm, the first insulating layer 200 may be formed to a thickness of about 8000 Å to about 9000 Å. Also, the thickness of the second insulating layer 220 may be smaller than the thickness of the first insulating layer 200.

In addition, when a flip-chip-type LED module is applied to a PCB, a side surface of the substrate 100 may have an uneven structure using a sawing or laser cutting process. Light generated in the active layer 120 is easily emitted to the outside through the substrate 100 having the side surface with the uneven structure.

In an LED module formed using the above-described processes, pads are formed on the patterned pad regions. Thus, local current crowding may be prevented. Also, diffusion of a metal is prevented by the reflection barrier layer provided between the conductive reflection layer 210 and the pads. For instance, a metal of the conductive reflection layer 210 is prevented from moving to the second pad 240 and increasing the resistivity of the second pad 240. Also, the second semiconductor layer 130 is electrically connected to the first pad 230. A pad barrier layer is formed on each of the pads. The pad barrier layer prevents diffusion of the metal generated during a bonding or soldering process so that the first pad 230 or the second pad 240 can have a high conductivity and be in electrical contact with the outside.

FIG. 30 is a cross-sectional view of an exemplary LED package according to another implementation of the disclosed technology.

Referring to FIG. 30, after a final resultant structure described with reference to FIGS. 28 and 29 is separated into respective unit modules, a phosphor layer 300 is formed on side and rear surfaces of each of the unit modules. The phosphor layer 300 may be formed by processes including re-arranging a plurality of separated unit modules such that the substrate 100 faces upward, and coating a phosphor slurry on the substrate 100. In this case, the phosphor slurry may also be coated on side surfaces of the modules. Subsequently, the phosphor slurry is cured and separated into respective modules.

Meanwhile, a package substrate 400 is provided. A first bonding pad 430 and a second bonding pad 440 may be disposed on the package substrate 400 and spaced apart from one another. A solder resist layer 420 having an opening exposing partial upper regions of the bonding pads 430 and 440 may be disposed on the bonding pads 430 and 440.

The module having the phosphor layer 300 is disposed on the package substrate 400. Thereafter, a first pad 230 and a second pad 240 of the module are electrically connected to the first bonding pad 430 and the second bonding pad 440 using conductive adhesives 430 and 450.

Furthermore, in the present implementation, the phosphor layer 300 absorbs light generated in the active layer 120 and generates light having a different wavelength. The phosphor layer 300 may be a single layer or have a multi-layered structure. For example, the phosphor layer 300 which has characteristics for wavelength conversion may have a stacked structure of a first phosphor layer (not shown) and a second phosphor layer (not shown). For instance, the first phosphor layer may have an regular uneven configurations defining grooves, and the second phosphor layer may be formed to fill grooves of the first phosphor layer.

In addition, when the phosphor layer 300 has characteristics for wavelength conversion into a plurality of wavelengths, the first phosphor layer may be formed of or include a different material from the second phosphor layer. Alternatively, the first and second phosphor layers may be formed of or include the same kind of phosphor with different concentrations.

The phosphor layer 300 may be coated or formed of a molding resin using a dispenser. Alternatively, the phosphor layer 300 may be formed using a spraying process, a molding process, a printing process, or a filling process in vacuum.

FIGS. 31(a) through 38 are plan views and cross-sectional views for describing an LED and a method for manufacturing the same according to implementations of the disclosed technology. In each of the drawings, the cross-sectional view illustrated in (b) is taken along A-A line of the plan view illustrated in (a), and points P1 and P2 are also illustrated in the cross-sectional view.

A light emitting structure 1200 is formed over a substrate 1100, the light emitting Structure 1200 including a first conductive type semiconductor layer 1210, an active layer 1230, and a second conductive type semiconductor layer 1250. The second conductive type semiconductor layer 1250 and the active layer 1230 are partially removed to form a region 1210a through which the first conductive type semiconductor layer 1210 is exposed.

The substrate 1100 may include any substrates as long as the substrates can grow the semiconductor layers 1210, 1230, and 1250. For example, the substrate 1100 may include a sapphire substrate, a silicon carbide substrate, a silicon substrate, a gallium nitride substrate, or an aluminum nitride substrate. In the present implementation, the substrate 1100 may include a patterned sapphire substrate (PSS). Furthermore, the substrate 1100 may be separated and removed from the first conductive type semiconductor layer 1210, after the LED is manufactured.

The first conductive type semiconductor layer 1210, the active layer 1230, and the second conductive type semiconductor layer 1250 may be sequentially grown. The first conductive type semiconductor layer 1210, the active layer 1230, and the second conductive type semiconductor layer 1250 may include a nitride semiconductor, and may be formed through a nitride semiconductor growing method such as MOCVD, HVPE, or MBE, which is publicly known to those skilled in the art.

The first conductive type semiconductor layer 1210, the active layer 1230, and the second conductive type semiconductor layer 1250 may include a III-V group compound semiconductor, for example, a nitride-based semiconductor such as (Al, Ga, In)N. In some implementations, the first conductive type semiconductor layer 1210 may include an n-type impurity (for example, Si), and the second conductive type semiconductor layer 1250 may include a p-type impurity (for example, Mg). In some implementations, the first conductive type semiconductor layer 1210 may include a p-type impurity, and the second conductive type semiconductor layer 1250 may include an n-type impurity. The active layer 1230 may include a multi-quantum well (MQW) structure.

The process of partially removing the second conductive type semiconductor layer 1250 and the active layer 1230 and forming the region 1210a through which the first conductive type semiconductor layer 1210 is exposed may include removing the second conductive type semiconductor layer 1250 and the active layer 1230 using a photolithography process. The photolithography process may use a mask pattern and dry etching. Furthermore, the process of forming the region 3210a through which the first conductive type semiconductor layer 1210 is exposed may further include removing a part of the first conductive type semiconductor layer 1210. Accordingly, as illustrated in FIG. 31(b), the top surface of the region 1210a may be positioned at a lower level than the top surface of the first conductive type semiconductor layer 1210 which is not removed. For example, as illustrated in FIGS. 31(a) and 31(b), the LED may include a plurality of mesas M. Each of the mesas M may include the second conductive type semiconductor layer 1250 and the active layer 1230. The mesa M may further include a part of the first conductive type semiconductor layer 1210. The arrangement of the plurality of mesas M is not limited, but the region 1210a through which the first conductive type semiconductor layer 1210 is exposed may be formed on the surface of the region where the mesa M is not formed.

The present implementation is not limited thereto, but the region 1210a through which the first conductive type semiconductor layer 1210 is exposed may be formed in various shapes. For example, the region 1210a may have the shape of a hole formed by partially removing the second conductive type semiconductor layer 1250 and the active layer 1230.

Referring to FIGS. 32(a) and 32(b), a defect blacking layer 1300 is formed. The defect blocking layer 1300 includes a masking region 1310 to partially cover the top surface of the second conductive type semiconductor layer 1250 and an opening region 1330 to partially expose the top surface of the second conductive type semiconductor layer 1250.

The defect blocking layer 1300 may be formed to partially cover the top surface of the second conductive type semiconductor layer 1250. For example, the defect blocking layer 1300 may be formed to nearly cover the entire top surfaces of the plurality of mesas M. As illustrated in FIG. 32A, the defect blocking layer 1300 may be formed to correspond to the top surfaces of the mesas M.

The top surface of the second conductive type semiconductor layer 1250 is partially exposed through the defect blocking layer 1300 which includes the opening region 1330 and the masking region 1310. As illustrated in FIGS. 32(a)

and 32(*b*), the opening region 1330 may include a plurality of openings isolated from each other. At this time, the plurality of openings may be positioned on each of the mesas M, and the top surface of the second conductive type semiconductor layer 1250 may be exposed through the plurality of openings. In some implementations, the plurality of openings may be surrounded by the masking region 1310, and the masking region 1310 may be arranged in the top surface region of the mesa M. In some implementations, the opening region 1330 and the masking region 1310 of the defect blocking layer 1300 may be arranged at different distribution densities.

For example, the defect blocking layer 1300 may be defined to include two or more regions. In some implementations, a ratio of the area of the opening region 1330 to the area of the masking region 1310 may be differently set in each of the regions. The two or more regions may have the shape of a concentric polygon facing the edge of the defect blocking layer 1300 from the center of the defect blocking layer 1300. For example, when the plan shape of the mesa M is a rectangle, the two or more regions may have the shape of a concentric rectangle. However, the present implementation is not limited thereto.

Figure 32:
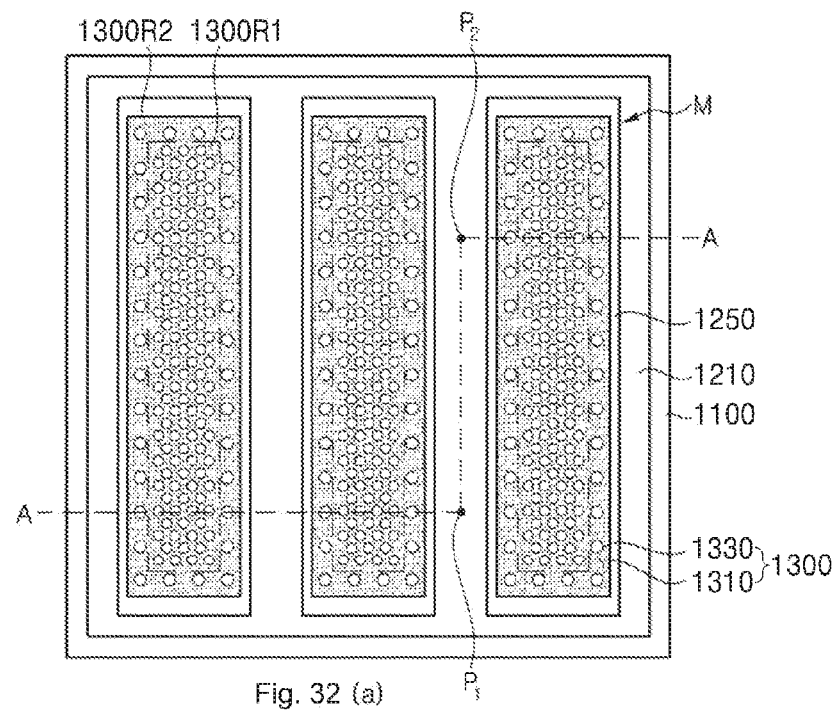
Figure 32:
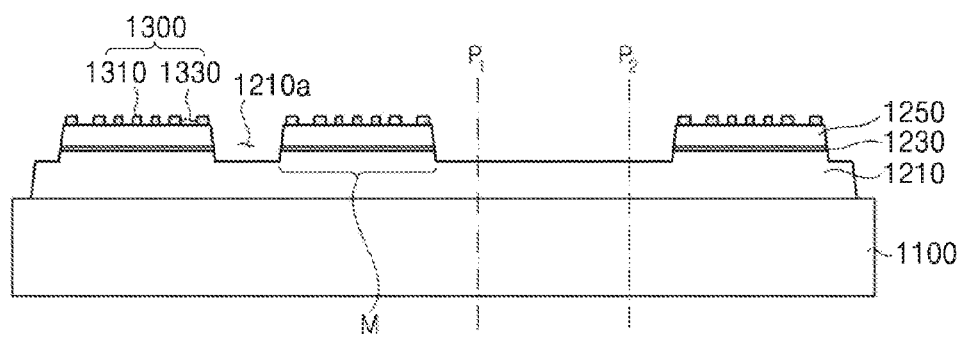

Referring to FIG. 32(*a*), the defect blocking layer 1300 may include a first region 1300R1 and a second region 1300R2. The second region 1300R2 may be positioned along the edge of the defect blocking layer 1300, and the first region 1300R1 may be positioned in the center of the defect blocking layer 1300 and surrounded by the second region 3100R2.

In the first region 1300R1, the opening region 1330 may have a greater area than the masking region 1310. In the second region 1300R2, the opening region 1330 may have a smaller area than the masking region 1310. For example, as illustrated in FIG. 32)(*a*), a distance between the openings of the opening region 1330 in the second region 1300R2 may be set to be greater than a distance between the openings of the opening region 1330 in the first region 1300R1. Thus, the area ratio of the opening region 1330 in the first region 1300R1 may be greater than the area ratio of the opening region 1330 in the second region 1300R2.

However, the present implementation is not limited thereto, but the defect blocking layer 1300 may further include one or more regions surrounding the second region 1300R2. At this time, in another region surrounding the second region 1300R2, the ratio of the area of the opening region 1330 to the area of the masking region 1310 may be set to be smaller than the ratio of the area of the opening region 1330 to the area of the masking region 1310 in the second region 1300R2. That is, the ratio of the area of the opening region 1330 to the area of the masking region 1310 may gradually decrease from the center of the defect blocking layer 1300 toward the edge of the defect blocking layer 1300.

As the distribution densities of the opening region 1330 and the masking region 1310 of the defect blocking layer 1300 are differently set in each of the regions, a contact area between the second conductive type semiconductor layer 1250 and a reflective electrode layer 1400 may be differently set in each of the regions during a subsequent process. This structure will be described below in detail.

Figure 33:
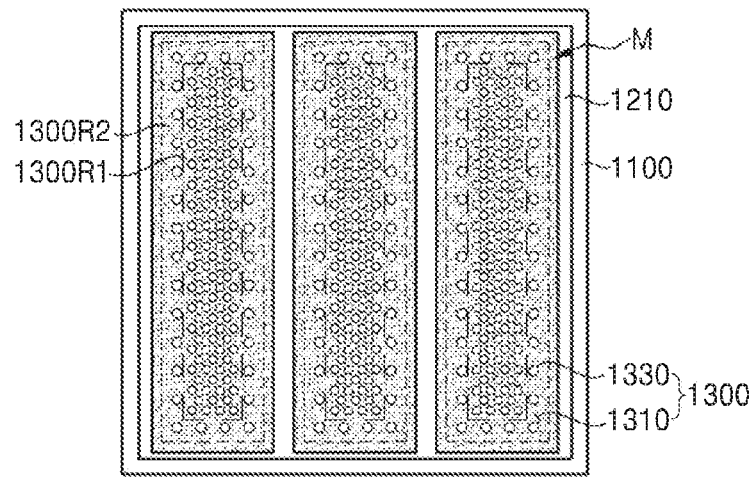
Figure 33:
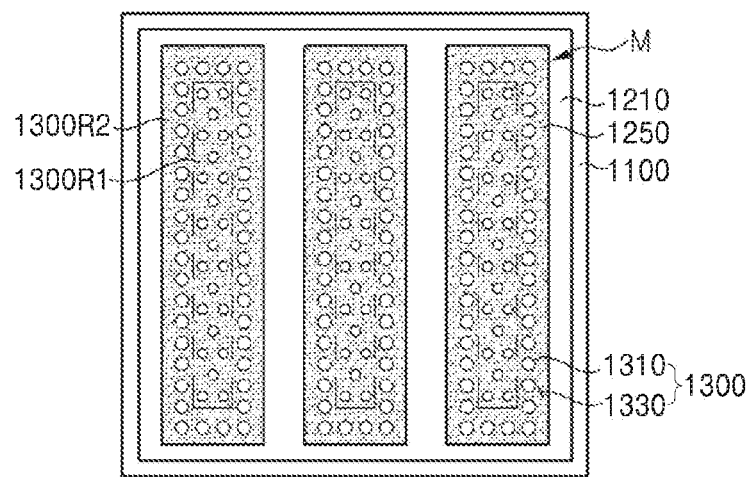
Figure 33:
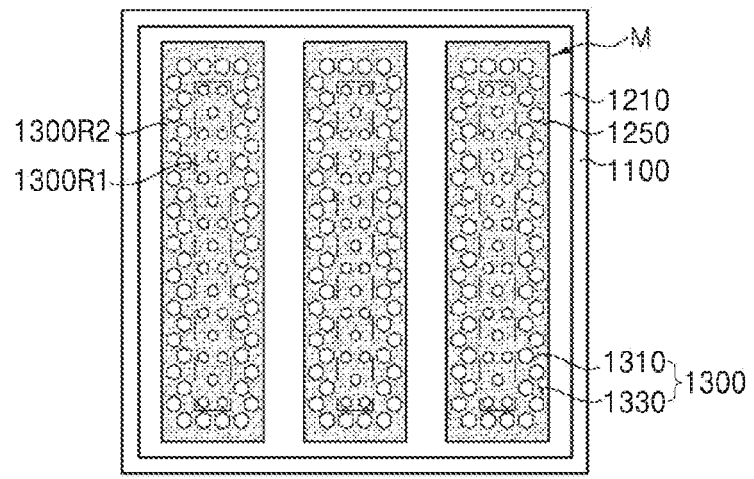

In some implementations, the masking region 1310 and the opening region 1330 of the defect blocking layer 1300 may be embossed or engraved, or have various shapes. For example, as illustrated in FIGS. 33(*a*) to 33(*c*), the defect blocking layer 1300 according to the present implementation may be formed in various shapes. FIGS. 33(*a*) to 33(*c*) illustrates various shapes of the defect blocking layer 1300, but the present implementation is not limited thereto.

Referring to FIG. 33(*a*), the opening region 1330 of the detect blocking layer 1300 may include a plurality of openings isolated from each other, and the masking region 1310 may cover not only the top surface of the second conductive type semiconductor layer 1350, but also the side surfaces of the second conductive type semiconductor layer 1250 and the active layer 1230. Thus, the masking region 1310 may not be limited to the top surface of each mesa M, but expanded to the side surfaces of the mesa M. In some implementations, the masking region 1310 may additionally cover a part of the region 1210*a* through which the first conductive type semiconductor layer 1210 is exposed. In this case, the second conductive type semiconductor layer 1250 is exposed only through the opening region 1310 of the defect blocking layer 1300. As the defect blocking layer 1300 is expanded to the side surfaces of the mesa M, the defect blocking layer 1300 can effectively protect the active layer 1230 from outside, and further reduce the probability that a short fail will occur when the LED is operated.

Referring to FIG. 33(*b*), the masking region 1310 of the defect blocking layer 1300 may include a plurality of masks isolated from each other. As illustrated in FIG. 33(*b*), the plurality of masks may be arranged on the top surfaces of the second conductive type semiconductor layer 1350 or the top surface of the mesa M. Thus, the second conductive type semiconductor layer 1250 is exposed through the opening region 1330 of the defect blocking layer 1300.

Referring to FIG. 33(*c*), the pattern of the defect blocking layer 1300 may include a polygonal pattern instead of a circular shape. FIGS. 33(*a*) and 33(*b*) of FIG. 32B illustrate that the openings or masks have a circular shape. However, the present implementation is not limited thereto, but the openings and masks may have a polygonal shape. For example, as illustrated in FIG. 33(*c*), the masks may have a hexagonal shape.

The shape of the defect blocking layer 1300 may be modified in various manners in consideration of current spreading efficiency and the region 1210*a* through which the first conductive type semiconductor layer 1210 is exposed. In the implementations described with reference to FIGS. 33(*a*) to 33(*c*), the defect blocking layer 1300 may include two or more regions, and a ratio of the area of the masking region 1310 to the area of the opening region 1330 may differ in each of the regions.

Referring back to FIGS. 32(*a*) and 32(*b*), the defect blocking layer 1300 may include an insulating layer. In some implementations, the insulating layer may have optical transparency. In some implementations, the defect blocking layer 1300 may include a plurality of dielectric materials stacked therein. The dielectric materials having different refractive indexes. For example, the defect blocking layer 1300 may include a distributed Bragg reflector. As the defect blocking layer 1300 includes a distributed Bragg reflector, the defect blocking layer 1300 may not only block a defect, but also improve light extraction efficiency. The defect Mocking layer 1300 including an insulating layer may be formed through a deposition and patterning process. Alternatively, the defect blocking layer 1300 may be formed through a deposition and lift-off process, but the present implementation is not limited thereto.

Figure 34:
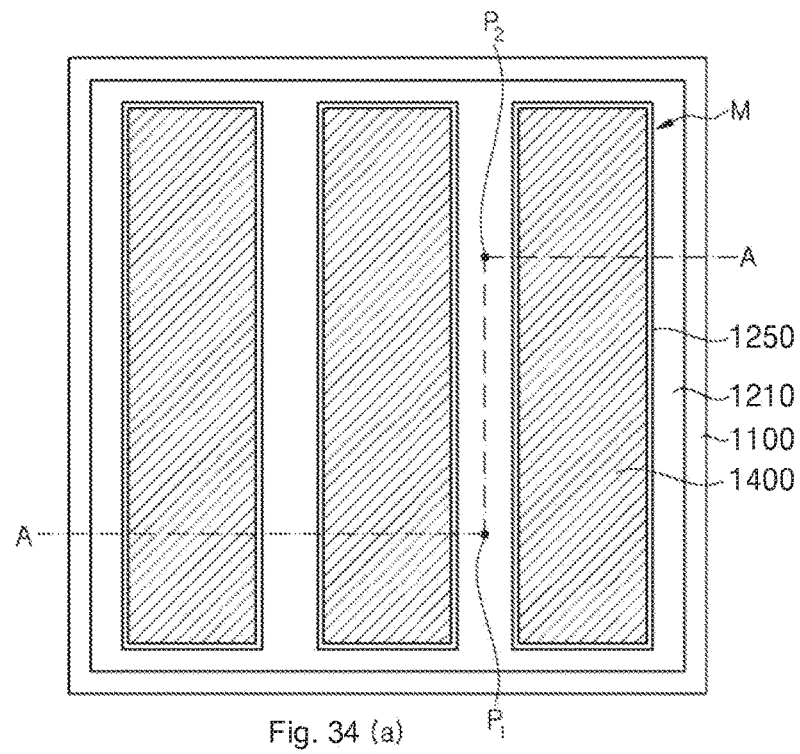
Figure 34:
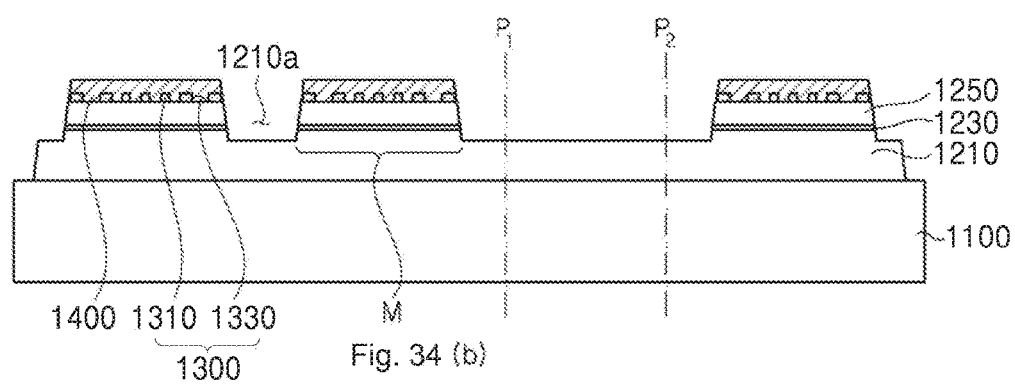

Referring to FIGS. 34(*a*) and 34(*b*), a reflective electrode layer 1400 is formed. The reflective electrode layer 1400 is positioned over the second conductive type semiconductor layer 1250 so as to form an ohmic contact, and covers at least a part of the defect blocking layer 1300. In some implementations, the reflective electrode layer 1400 may cover 90% or more of the top surface of the second conductive type semiconductor layer 1250. Thus, the reflective electrode layer 1400 may reflect most of light emitted from the active layer 1230. The reflective electrode layer 1400 may be formed through a plating or deposition method, and arranged at a desired position through a patterning or lift-off process.

The reflective electrode layer 1400 may include a reflective layer and a cover layer to cover the reflective layer.

As described above, the reflective electrode layer 1400 may form an ohmic contact with the second conductive type semiconductor layer 1250, and serve to reflect light. Thus, the reflective layer may include a metal which has high reflectance and forms ohmic contact with the second conductive type semiconductor layer 1250. For example, the reflective layer may include one or more of Ni, Pt, Pd, Rh, W, Ti, Al, Ag, or Au. Furthermore, the reflective layer may include a single-layer or multilayer structure.

The cover layer may prevent inter-diffusion between the reflective layer and another material, and prevent damage of the reflective layer, which may occur when an external material diffuses to the reflective layer. Therefore, the cover layer may be formed to cover the bottom and side surfaces of the reflective layer. The cover layer can be electrically connected to the second conductive type semiconductor layer 1250, and thus serve as a kind of electrode with the reflective layer. The cover layer may include one or more of Au, Ni, Ti, or Cr, for example, and have a single-layer or multilayer structure.

The reflective electrode layer 1400 may cover the defect blocking layer 1300. In some implementations, the reflective electrode layer 1400 may be in contact with the second conductive type semiconductor layer 1250 through the opening region 1330 of the defect blocking layer 1300, thereby forming an ohmic contact.

The region and arrangement in which the reflective electrode layer 1400 are in contact with the second conductive type semiconductor layer 1250 may be determined according to me shape of the defect blocking layer 1300. For example, when the defect blocking layer 1300 is restrictively formed on the top surfaces of the mesas M as illustrated in FIGS. 34(a) and 34(b), the defect blocking layer 1300 may be completely covered by the reflective electrode layer 1400. Furthermore, the reflective electrode layer 1400 may form an ohmic contact with the second conductive type semiconductor layer 1250 through the opening region 1330 of the defect blocking layer 1300 and the top surface of the second conductive type semiconductor layer 1250 in the region where the defect blocking layer 1300 is not formed. Similarly, when the defect blocking layer 1300 is formed as illustrated in FIGS. 33(b) and 33(c), the defect blocking layer 1300 may be completely covered by the reflective electrode layer 1400.

When the defect blocking layer 1300 is formed as illustrated in FIG. 33(a), the defect blocking layer 1300 may not be completely covered by the reflective electrode layer 1400. In this case, the reflective electrode layer 1400 may be in contact with the second conductive type semiconductor layer 1250 only through the plurality of openings of the defect blocking layer 1300.

The reflective electrode layer 1400 forms an ohmic contact while being in contact with the second conductive type semiconductor layer 1250 through the opening region 1330 of the defect blocking layer 1300, and the contact between the reflective electrode layer 1400 and the second conductive type semiconductor layer 1250 may be blocked in the masking region 1310. When the reflective electrode layer 1400 forms an ohmic contact while being in contact with the second conductive type semiconductor layer 1250, a leakage current may be generated along a defect such as potential, in case where the defect comes in direct contact with the reflective electrode layer 1400. Furthermore, since the contact pan between the defect and the reflective electrode layer 1400 is vulnerable to external static electricity, the LED may cause static electricity discharge.

According to the present implementation, however, the masking region 1310 of the defect blocking layer 1300 is partially formed between the reflective electrode layer 1400 and the second conductive type semiconductor layer 1250, and reduces the ratio of the region in which the second conductive type semiconductor layer 1250 and the reflective electrode layer 1400 are in direct contact with each other. Thus, the probability that the second conductive type semiconductor layer 1250 and the reflective electrode layer 1400 are in direct contact with each other is reduced, which may decrease the probability that damage will occur due to a leakage current or static electricity discharge. Therefore, the reliability and durability of the LED can be improved.

In some implementations, the defect blocking layer 1300 may include an insulating layer having optical transparency or a distributed Bragg reflector, which reflect light to improve light extraction efficiency of the LED. In some implementations, since the defect blocking layer 1300 is formed of or includes a material different from the reflective electrode layer 1400 and the second conductive type semiconductor layer 1250, the masking region 1310 of the defect blocking layer 1300 may even scatter light, thereby further improving light extraction efficiency. Therefore, the light intensity of the LED according to the present implementation may be improved.

Figure 35:
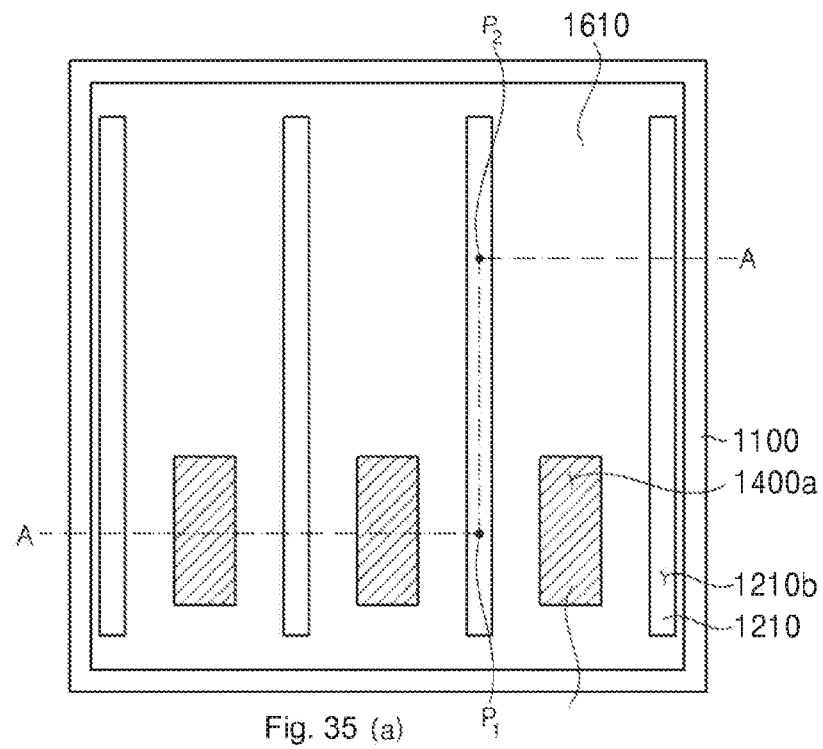
Figure 35:
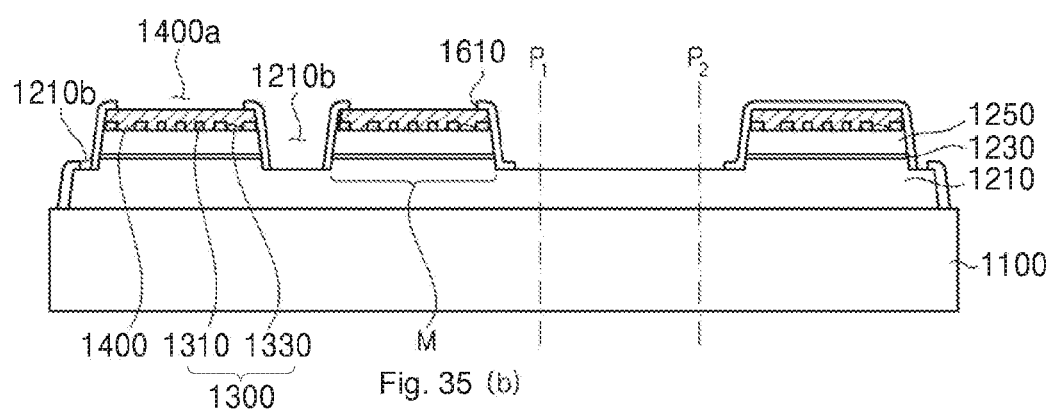

Referring to FIG. 35, a lower insulating layer 1610 may be formed to partially cover the semiconductor layers 1210, 1230, and 1250 and the reflective electrode layer 1400. The lower insulating layer 1610 may cover the side surfaces of the semiconductor layers 1210, 1230, and 1250, and include first and second openings 1210b and 1400a. The first opening 1210b may expose the first conductive type semiconductor layer 1210, and the second opening 1400a may partially expose the reflective electrode layer 1400.

The first opening 1210b may be formed along the relatively long side surface of the mesa M, and the second opening 1400a may be formed to expose the reflective electrode layer 1400 of the mesa M. However, the present implementation is not limited thereto.

The lower insulating layer 1610 may include an insulating material, for example, $SiO_2$ or $SiN_x$. In some implementations, the lower insulating layer 1610 may have a multilayer structure, and include a distributed Bragg reflector in which materials having different reflective indexes are alternately stacked. The lower insulating layer 1610 may be formed through a deposition method such as E-beam evaporation or PECVD, and arranged at a desired position through a patterning or lift-off process.

Figure 36:
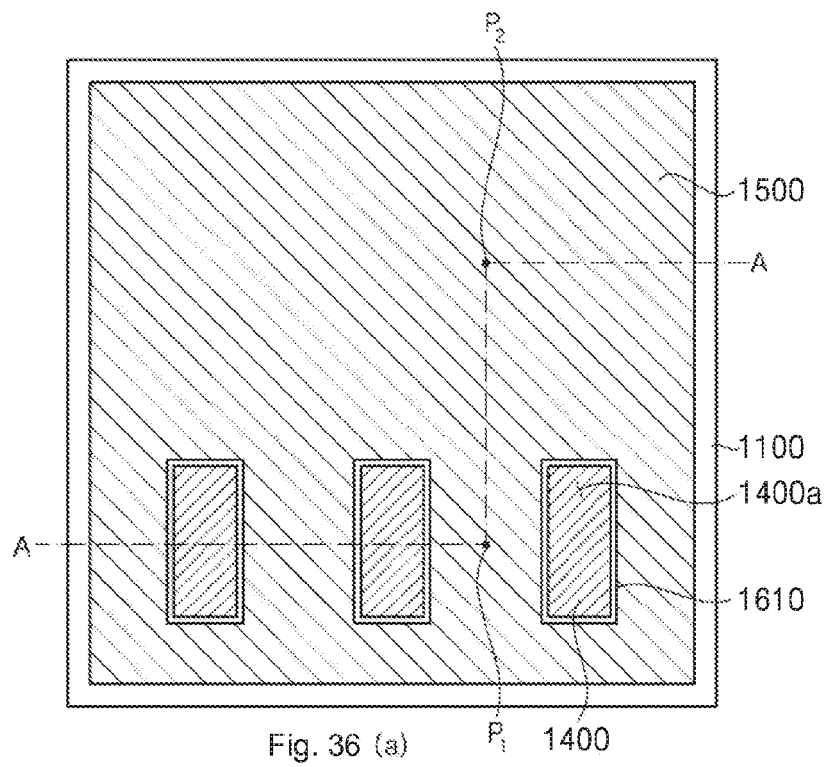
Figure 36:
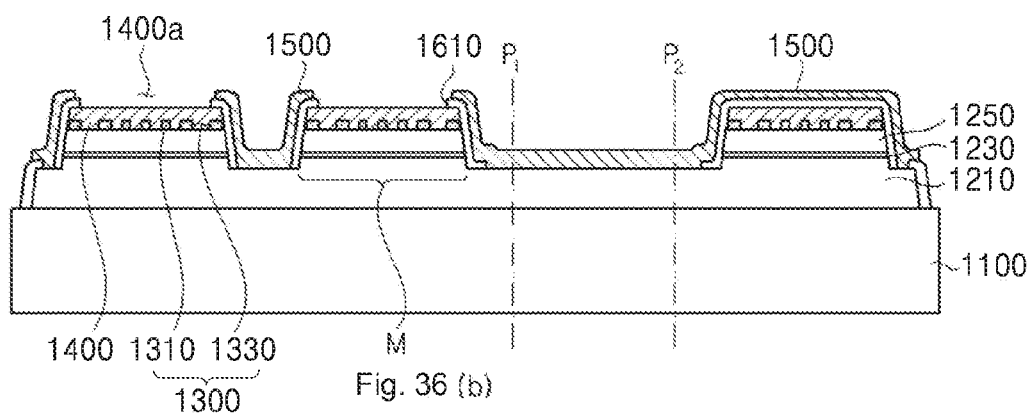

Referring to FIG. 36, a first metal layer 1500 may be positioned over the semiconductor layers 1210, 1230, and 1250, and partially cover the lower insulating layer 1610. In some implementations, the first metal layer 1500 may fill the first opening 1210b of the lower insulating layer 1610, and form an ohmic contact while being in contact with the first conductive type semiconductor layer 1210. On the other hand, the first metal layer 1500 is not formed within the second opening 1400a, and thus insulated from the reflective electrode layer 1400. The first metal layer 1500 may be insulated from the side surfaces of the reflective electrode layer 1400 and the mesas M. As the lower insulating layer 1610 is positioned between the first metal layer 1500 and the reflective electrode layer 1400, the first metal layer 1500 and the reflective electrode layer 1400 may be insulated from each other.

The first metal layer 1500 may form an ohmic contact with the first conductive type semiconductor layer 1210 through the first opening 1210*b* formed long the major-axis side surface of the mesa M. When the LED according to the present implementation is operated, the first conductive type semiconductor layer 1210 may transfer current through the first metal layer 1500, and the second conductive type semiconductor layer 1250 may transfer current through the reflective electrode layer 1400 on the mesa M. Thus, current may crowd at the edge of a mesa M which is positioned relatively close to the region in which the first metal layer 1500 is in contact with the first conductive type semiconductor layer 1210. When current crowds at the edge of the mesa M, light emission is concentrated on the edge of the mesa M, and light emission uniformity is degraded. Furthermore, the current crowding region may increase the probability that damage will occur due to a leakage current and static electricity discharge.

According to the present implementation, however, the opening region 1330 and the masking region 1310 of the defect blocking layer 1300 may be arranged at different distribution densities, and thus prevent current crowding. In a current crowing region, the area of the opening region 1330 of the defect blocking layer 1300 may be set to be smaller than the area of the masking region 1310. In the opposite case, in the region where the current is not crowded, the area of the opening region 1330 may be set to be greater than the area of the masking region 1310, thereby increasing current spreading efficiency.

For example, when the defect blocking layer 1300 includes the first and second regions 1300R1 and 1300R2 as illustrated in FIG. 32(*a*), 32(*b*) or 33(*a*) to (*c*), the area of the opening region 1330 in the first region 1300R1 may be greater than the area of the masking region 1310. In the second region 1300R2, however, the area of the opening region 1330 may be smaller than the area of the masking region 1310. Since the second region 1300R2 is positioned at the edge of the mesa M, the second region 1300R2 is close to the region in which the first metal layer 1500 is in contact with die first conductive type semiconductor layer 1210. Therefore, as the defect blocking layer 1300 is formed in the second region 1300R2 such that the opening region 1330 has a smaller area than the masking region 1310, current can be prevented from crowding at the second region 1300R2. On the other hand, in the first region 1300R1 remote from the region where the first metal layer 1500 is in contact with the first conductive type semiconductor layer 1210, the defect blocking layer 1300 may be formed in such a manner that the opening region 1330 has a greater area than the masking region 1310. Thus, current may be more easily conducted. Therefore, current may be uniformly spread across the entire mesa M.

However, the present implementation is not limited thereto, but the defect blocking layer 1300 may further include one or more regions surrounding the second region 1300R2. At this time, in another region surrounding the second region 1300R2, the ratio of the area of the opening region 1330 to the area of the masking region 1310 may be set to be smaller than the ratio of the area of the opening region 1330 to the area of the masking region 1310 in the second region 1300R2. That is, the ratio of the area of the opening region 1330 to the area of the masking region 1310 may be set to gradually decrease from the center of the defect blocking layer 1300 toward the edge of the defect blocking layer 1300. Thus, it is possible to effectively prevent current density from decreasing as it is remote from the region where the first metal layer 1500 is in contact with the first conductive type semiconductor layer 1210.

The first metal layer 1500 may be formed through a plating or deposition method, and include a material which not only forms an ohmic contact with the first conductive type semiconductor layer 1210, but also has optical reflectivity. For example, the first metal layer 1500 may include one or more of Ni, Pt, Pd, Rh, W, Ti, Al, Ag, or Au. Furthermore, the first metal layer 1500 may have a single-layer or multilayer structure.

As the first metal layer 1500 is formed to cover the semiconductor layers 1210, 1230, and 1250 except partial regions, current spreading efficiency can be further improved. Furthermore, since the part which is not covered by the reflective electrode layer 1400 can be covered by the first metal layer 1500, light can be more effectively reflected to improve light emission efficiency of the LED.

Figure 37:
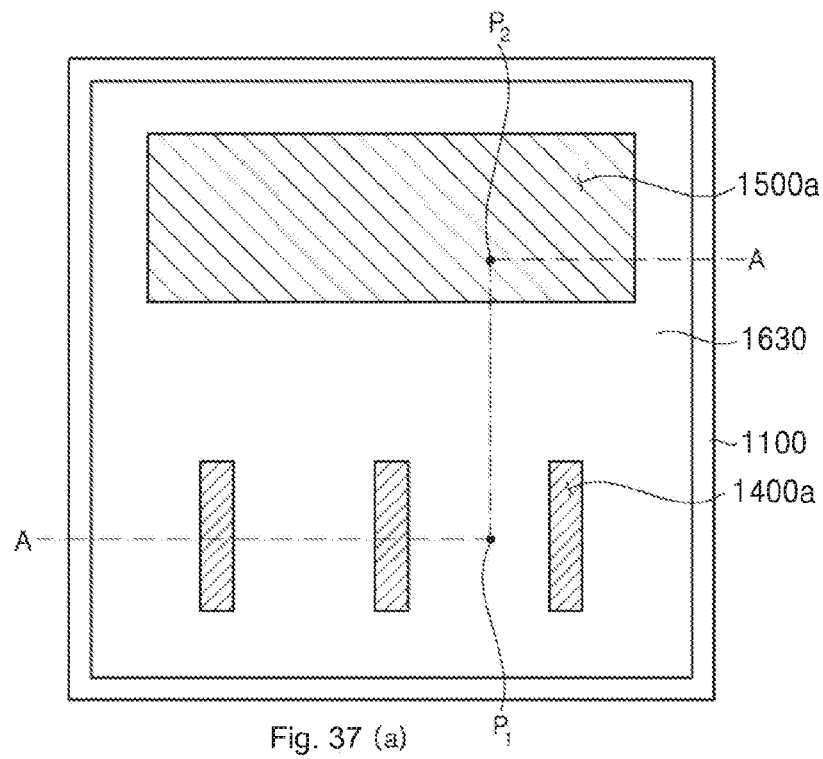
Figure 37:
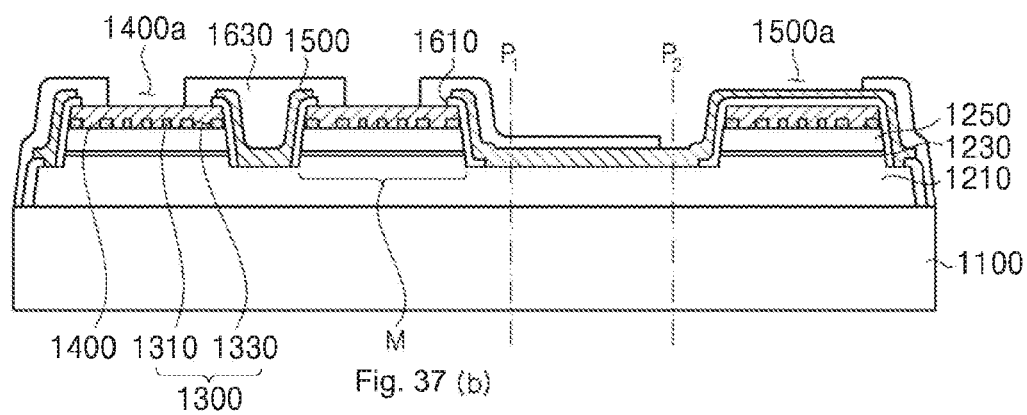

Referring to FIG. 37, an upper insulating layer 1630 may be formed to cover a part of the first metal layer 1500 and a part of the reflective electrode layer 1400. The upper insulating layer 1630 may include a third opening 1500*a* to partially expose the first metal layer 1500 and a second opening 1400*a* to expose the reflective electrode layer 1400.

The upper insulating layer 1630 may include an insulating material, for example. $SiO_2$ or $SiN_x$. Furthermore, the upper insulating layer 1630 may have a multilayer structure, and include a distributed Bragg reflector in which materials having different reflective indexes are alternately stacked. The upper insulating layer 1630 may be formed through a deposition method such as E-beam evaporation or PECVD, and arranged at a desired position through a patterning or lift-off process.

The third opening 1500*a* may be isolated from the second opening 1400*a* such that the third and second openings 1500*a* and 1400*a* are formed at the opposite positions. For example, as illustrated in FIG. 37, the third opening 1500*a* may be arranged at one side, and the second opening 1400*a* may be arranged at the opposite side. The third opening 1500*a* and the second opening 1400*a* may be arranged under the positions at which electrode pads electrically connected to the first metal layer 1500 and the reflective electrode layer 1400 are to be formed.

The upper insulating layer 1630 may include an insulating material, for example, $SiO_2$ or $SiN_x$. Furthermore, the upper insulating layer 1530 may have a multilayer structure, and include a distributed Bragg reflector in which materials having different reflective indexes are alternately stacked.

Then, referring to FIG. 38, first and second pads 1710 and 1730 may be formed. Thus, the LED according to the implementation may be provided.

The first and second pads 1710 and 1730 may fill the third and second openings 1500*a* and 1400*a* so as to be electrically connected to the first metal layer 1500 and the reflective electrode layer 1400, respectively. Thus, the first and second pads 1710 and 1730 may serve as electrodes for supplying power to the LED from outside.

The first and second pads 1710 and 1730 are isolated from each other. The first and second pads 1710 and 1730 may include an adhesive layer such as Ti, Cr, or Ni and a high-conductivity metal layer such as Al, Cu, Ag, or Au. The first and second pads 1710 and 1730 may be formed through a deposition or plating method, and simultaneously or separately formed.

In the LED according to the present implementation, the substrate 1100 may be omitted. The substrate 1100 may be separated and removed from the first conductive type semiconductor layer 1210 through a technology which is publicly known to those skilled in the art. The substrate 1100 may be separated or removed from the light emitting structure through a physical and/or chemical method. For example, the substrate 1100 may be separated or removed through laser lift-off, chemical lift-off, stress lift-off, or polishing.

The time at which the substrate 1100 is separated may be not limited. After the semiconductor layers 1210, 1230, and 1250 are grown, the substrate 1100 may be removed any time.

Furthermore, the LED may further include a heat radiation pad. The heat radiation pad may be positioned over the upper insulating layer 1630, and discharge heat which is generated when the LED emits light. For example, the heat radiation pad may be positioned between the first and second pads 1710 and 1730, and electrically insulated. The heat radiation pad may include a material having high conductivity, for example, Cu.

As the LED includes the heat radiation pad, the heat radiation pad can effectively discharge heat which is generated when the LED emits light, and improve the lifetime and reliability of a high-power and large-area flip-chip LED. Furthermore, the heat radiation pad can prevent the LED from being degraded by heat generated when the LED emits light.

Although some embodiments and examples of the disclosed technology have been described above, the disclosed technology is not limited by the disclosed embodiments and examples, and can be implemented in various ways.

What is claimed is:

1. A light emitting diode (LED) module comprising:
   a package substrate;
   a first bonding pad and a second bonding pad formed over the package substrate to be separated from each other;
   an LED unit electrically connected to the first and the second bonding pads; and
   a phosphor layer covering the LED unit;
   wherein the LED unit includes:
   a first semiconductor layer,
   a second semiconductor layer,
   an active layer disposed between the first and second semiconductor layer;
   a reflective layer formed over the second semiconductor layer;
   an insulating layer formed over the reflective layer and having a first pattern of holes and a second pattern of holes, the first pattern of holes exposing selective portions of the reflective layer;
   a first pad formed over the insulation layer to cover the first pattern and coupled to the first bonding pad, the first pad electrically connected to the second semiconductor layer; and
   a second pad formed over the insulation layer to cover the second pattern and coupled to the second bonding pad.

2. The light emitting diode module of claim 1, further including a solder resist layer through which the first pad and the second pad are coupled to the first bonding pad and the second bonding pad, respectively.

3. The light emitting diode module of claim 1, further including a conductive reflection layer formed between the reflective layer and the insulating layer.

4. The light emitting diode module of claim 1, further including an additional insulating layer disposed between the reflective layer and the second pattern of the insulation layer.

5. The light emitting diode module of claim 1, wherein the phosphor layer includes a first phosphor layer and a second phosphor layer.

6. The light emitting diode module of claim 1, wherein the second pad is electrically connected to the first semiconductor layer.

7. The light emitting diode module of claim 1, wherein an area of the first pad is greater than an area of the second pad.

8. The light emitting diode module of claim 1, wherein the first pattern of holes is formed in a first pad region and the second pattern of holes is formed in a second pad region such that a number of holes in the first pad region is equal to or greater than a number of holes in the second pad region.

9. The light emitting diode module of claim 3, wherein the second pattern of holes exposes selective portions of the conductive reflection layer.

10. A light emitting diode (LED) module comprising:
    a light emitting structure including a first conductive type semiconductor layer, an active layer, a second conductive type semiconductor layer, and a reflective layer;
    a first insulation layer formed over the light emitting structure and patterned to expose at least a portion of the reflective layer;
    a conductive reflection layer formed over the first insulation layer;
    a second insulation layer formed over the conductive reflection layer and patterned to expose at least a portion of the conductive reflection layer;
    a first pad formed to be electrically connected to the exposed portion of the reflective layer;
    a second pad formed to be electrically connected to the exposed portion of the conductive reflection layer;
    a first bonding pad electrically connected to the first pad; and
    a second bonding pad electrically connected to the second pad.

11. The light emitting diode module of claim 10, wherein an area of the exposed reflective layer is greater than an area of the exposed conductive reflective layer.

12. The light emitting diode module of claim 10, further including a phosphor layer covering lateral sides of the light emitting structure.

13. The light emitting diode module of claim 10, wherein the patterned first insulation layer and the patterned second insulation layer include holes.

14. The light emitting diode module of claim 10, wherein the reflective layer exposed by the patterned first insulation layer and the conductive reflection layer exposed by the patterned second insulation layer are formed over different regions of the light emitting structure.

15. The light emitting diode module of claim 10, further including a solder resist layer through which the first pad and the second pad are coupled to the first bonding pad and the second bonding pad, respectively.

16. The light emitting diode module of claim 10, further including a package substrate coupled to the first bonding pad and the second bonding pad.

17. The light emitting diode module of claim 10, wherein the first insulating layer, the conductive insulation layer, and the second insulation layer are sequentially formed over at least a portion of a top surface of the light emitting structure has a side.

18. The light emitting diode module of claim 13, wherein the holes in the patterned first insulation layer and the holes in the second insulation layer are formed over different portions of the light emitting structure.

* * * * *